US012641825B2

(12) United States Patent (10) Patent No.: US 12,641,825 B2
You et al. (45) Date of Patent: May 26, 2026

(54) DEVICE SCALING BY ISOLATION ENHANCEMENT

(71) Applicant: Taiwan Semiconductor Manufacturing Co., Ltd., Hsinchu (TW)

(72) Inventors: Jia-Chuan You, Hsinchu (TW); Chia-Hao Chang, Hsinchu (TW); Kuo-Cheng Chiang, Hsinchu (TW); Chih-Hao Wang, Hsinchu (TW); Sheng-Tsung Wang, Hsinchu (TW); Chun-Yuan Chen, Hsinchu (TW); Li-Zhen Yu, Hsinchu (TW); Lin-Yu Huang, Hsinchu (TW); Huan-Chieh Su, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 662 days.

(21) Appl. No.: 17/884,394

(22) Filed: Aug. 9, 2022

(65) Prior Publication Data

US 2023/0335645 A1 Oct. 19, 2023

Related U.S. Application Data

(60) Provisional application No. 63/331,649, filed on Apr. 15, 2022.

(51) Int. Cl.
H01L 29/786 (2006.01)
H01L 29/423 (2006.01)
(Continued)

(52) U.S. Cl.
CPC ....... H10D 30/6706 (2025.01); H10D 30/014 (2025.01); H10D 30/031 (2025.01); (Continued)

(58) Field of Classification Search
CPC ............. H10D 30/6706; H10D 30/014; H10D 30/031; H10D 30/6729; H10D 30/6735; (Continued)

(56) References Cited

U.S. PATENT DOCUMENTS 10,128,334 B1 * 11/2018 Bourjot ................ H10D 64/679
2005/0081781 A1 * 4/2005 Lin ....................... H10D 64/667
257/E21.202

(Continued)

FOREIGN PATENT DOCUMENTS

TW 202205682 A 2/2022
TW 202213632 A 4/2022

*Primary Examiner* — Steven B Gauthier
*Assistant Examiner* — Rhys Poniente Sheker
(74) *Attorney, Agent, or Firm* — Seed IP Law Group

(57) ABSTRACT

A device includes a gate electrode and a gate dielectric surrounding the gate electrode. The gate electrode surrounds a nanostructure. The nanostructure includes stacked nanosheets. The gate dielectric is formed by a high-k (HK) material. The HK material covers sidewalls of the gate electrode in a direction aligned to adjacent devices. Portions of the HK material are recessed from the sidewalls and refilled by a dielectric material with a dielectric constant less than the HK material and an electrical isolation capability greater than the HK material. Replacing the HK material over the sidewalls of the gate electrode with the dielectric material enhances electrical isolation between the gate electrode with adjacent contacts. Consequently, it can reduce electrical leakage between metal gate (MG) contacts and metal-to-device (MD) contacts in scaled transistors of an integrated circuit (IC).

20 Claims, 25 Drawing Sheets

(51) Int. Cl.

| | |
|---|---|
| *H10D 30/01* | (2025.01) |
| *H10D 30/67* | (2025.01) |
| *H10D 64/01* | (2025.01) |
| *H10D 64/20* | (2025.01) |
| *H10D 30/43* | (2025.01) |

(52) U.S. Cl.
CPC ..... *H10D 30/6729* (2025.01); *H10D 30/6735* (2025.01); *H10D 64/01* (2025.01); *H10D 64/015* (2025.01); *H10D 64/205* (2025.01); *H10D 30/43* (2025.01); *H10D 30/6739* (2025.01); *H10D 30/6757* (2025.01)

(58) Field of Classification Search
CPC ........... H10D 30/6739; H10D 30/6757; H10D 30/797; H10D 30/501–509; H10D 30/019–0198; H10D 64/01; H10D 64/015; H10D 64/205; H10D 64/017; H10D 62/822; H10D 62/121; H10D 84/0149; H10D 84/038
See application file for complete search history.

(56) References Cited

U.S. PATENT DOCUMENTS

| | | | | |
|---|---|---|---|---|
| 2019/0067467 A1* | 2/2019 | Zhou | .................. | H10D 84/0184 |
| 2020/0027959 A1* | 1/2020 | Cheng | .................. | H10D 64/679 |
| 2020/0091149 A1* | 3/2020 | Lee | ..................... | H01L 21/3065 |
| 2021/0098365 A1 | 4/2021 | Chou et al. | | |
| 2023/0099214 A1* | 3/2023 | Miao | .................. | H10D 30/6757 |
| | | | | 257/288 |

* cited by examiner

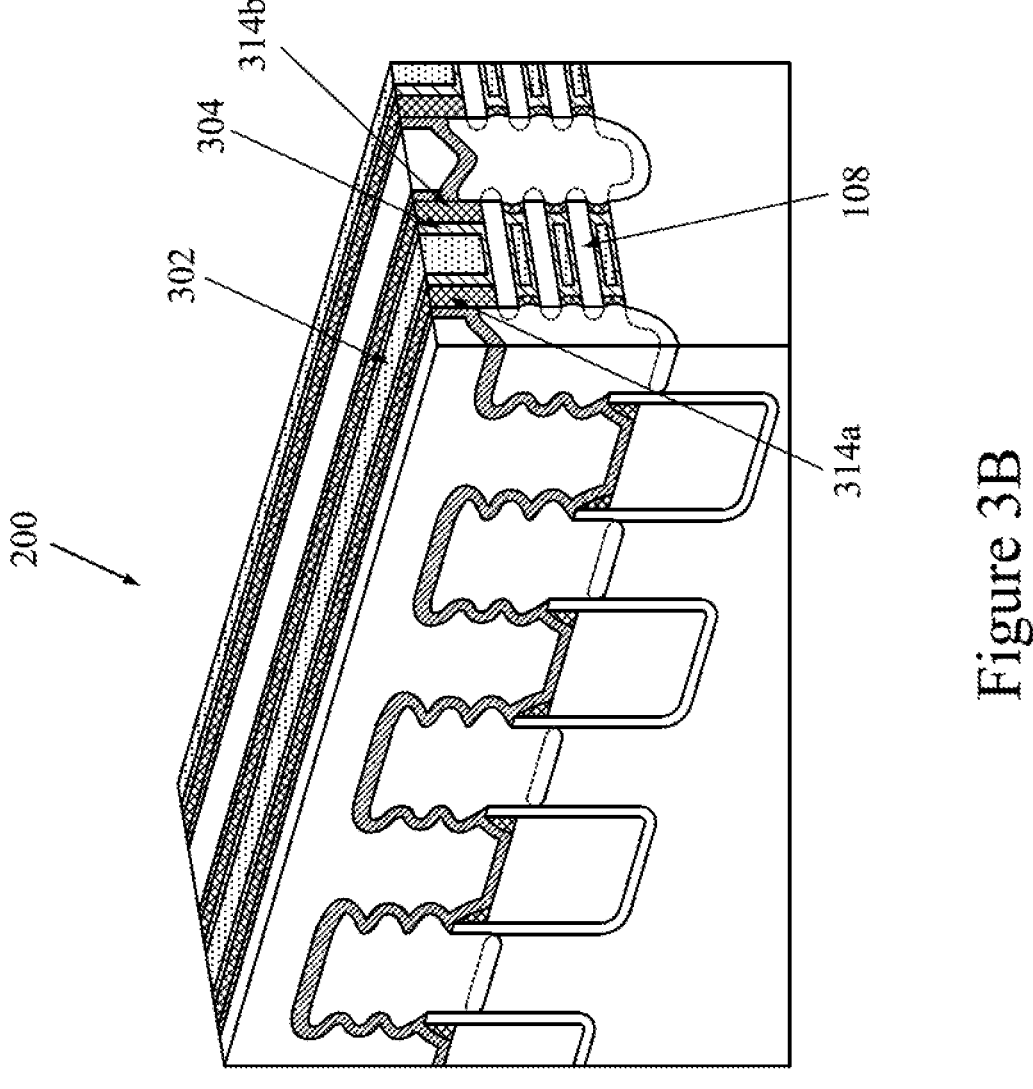
Figure 3B
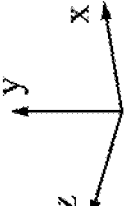

700

702p

702

900A

900 — Forming fin-like structures and nanostructures

910 — Forming poly-gate structure

920 — Forming gate spacers and Source/Drain regions

930 — Forming first liner and ILD-0 layer

940 — Forming high-k layer and metal gate (MG)

950 — Etching back portions of the first liner, spacers, and high-k layer

960 — Forming second liner and ILD-1 layer

900B

902 — Forming high-k layer and metal gate (MG)

912 — Etching back portion of MG

922 — Forming MG capping layer

932 — Etching back portions of high-k layer

942 — Refilling the etched portions with a dielectric capping layer

952 — Forming metal-to-device (MD) contacts

962 — Forming VG and VD contacts

DEVICE SCALING BY ISOLATION ENHANCEMENT

BACKGROUND

By advancement of nano- and micro-fabrication technologies in semiconductor integrated circuits (ICs), scaling down dimensions of semiconductor devices benefits new generations of ICs. In general, a functional density of an IC, that is introduced based on number of interconnected devices per a chip area, depends on a geometry size of the IC based on the fabrication process. The geometry size is defined by minimum size of a line or component that can be created in the respective fabrication process. Scaling down the components size, known as "scaling," enhances the geometry size, and consequently increases functional density of the IC. Accordingly, efficiency and cost of production process can be enhanced by scaling.

In particular, the scaling benefits IC technology in static random access memory (SRAM), where the performance of SRAMs are enhanced by scaling semiconductor devices such as fin-like field effect transistors (FinFET) and gate-all-around (GAA) transistors. These types of transistors incorporate multiple gates into a single semiconductor device while a single gate controls the multiple gates. In some recent designs of GAA-FinFET, multiple gates are formed as a nanostructure, including stacked metal layers and a fin-like gate that surrounds all sides of a vertical semiconductor channel.

BRIEF DESCRIPTION OF THE DRAWINGS

Aspects of the present disclosure are best understood from the following detailed description when read with the accompanying figures. It is noted that various features are not drawn to scale.

FIGS. 3A-3D are views illustrating further processing of the semiconductor device for manufacturing the semiconductor device in FIG. 1A, in accordance with some embodiments.

DETAILED DESCRIPTION

Figure 1A:
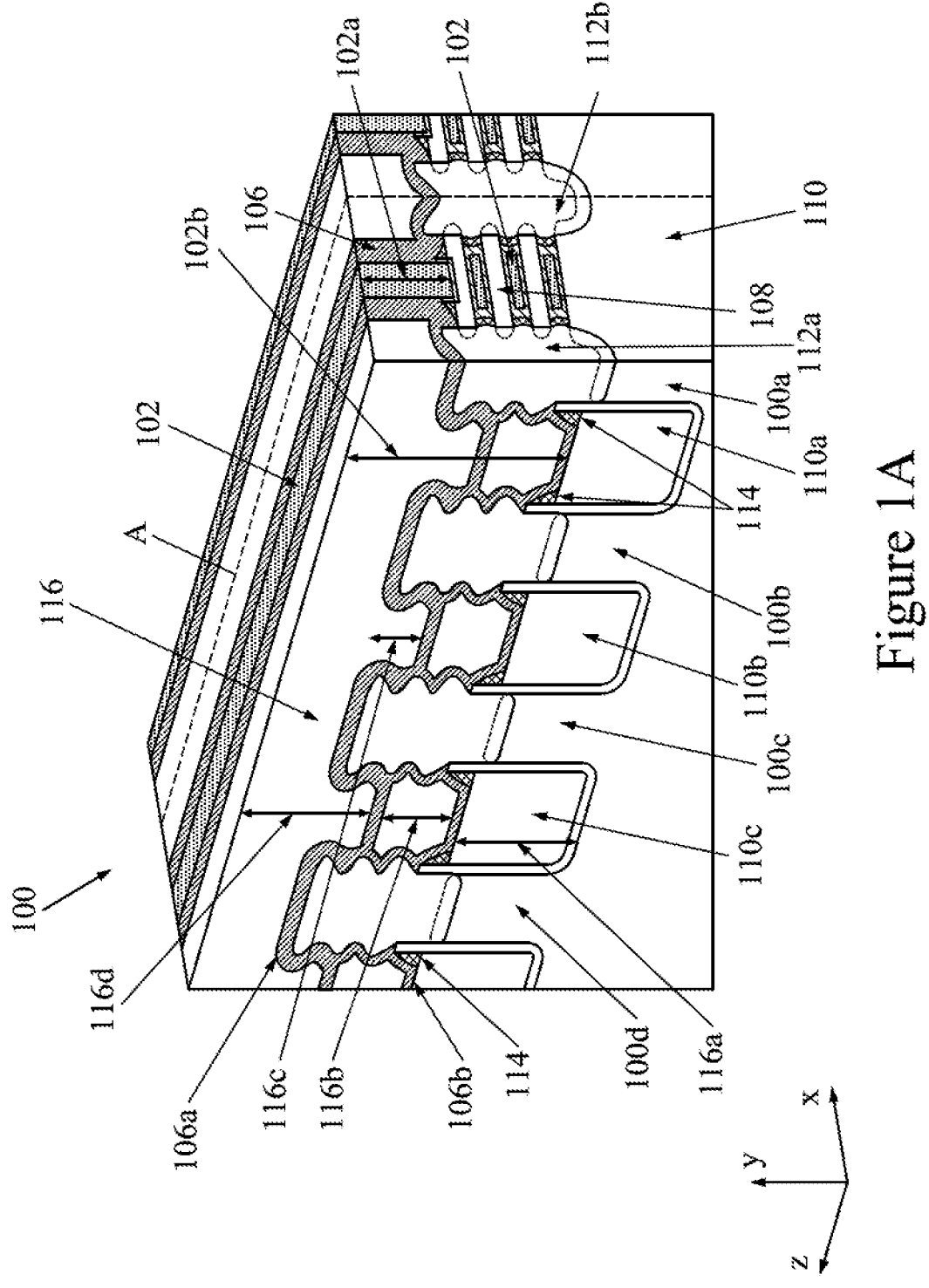
FIG. 1A is a three-dimensional view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to a technique for enhancing isolation between contacts of one or more devices. In particular, the enhanced isolation benefits scaling of devices for integrated circuit applications. In some embodiments, the present disclosure is directed to a circuit including multiple devices formed on a common semiconductor substrate. In some examples, the circuit may be an integrated circuit (IC) including multiple transistors. The transistors may have the same structure and be fabricated in the same process. For instance, the transistors may be fin-like field effect transistors (FinFET), gate-all-around (GAA), or a combination thereof. The present disclosure introduces a method to enhance electrical isolation between the devices of the circuit which benefits scaling the IC.

Gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

In various embodiments, each device includes a gate electrode and a gate dielectric surrounding the gate electrode. In some examples, the gate electrode at least partially surrounds a nanostructure, which may operably form a channel region of a transistor. The nanostructure may include stacked semiconductor nanosheets. The gate dielectric may be formed by a high-k (HK) material. In some examples, the HK material covers sidewalls of the gate electrode in a direction aligned to adjacent devices. In some embodiments, portions of the HK material are recessed from the sidewalls and refilled with a dielectric material with a dielectric constant less than the HK material. In this fashion, electrical isolation capability of the dielectric material is greater than the HK material. Hence, replacing the HK material over the sidewalls of the gate electrode with the dielectric material enhances electrical isolation between the gate electrode with adjacent contacts. It can reduce electrical leakage between metal gate (MG) contacts and metal-to-device (MD) contacts in scaled transistors of the IC.

FIG. 1A is a three-dimensional view of a semiconductor device 100. The device 100 shown in FIG. 1A may represent only a portion of a semiconductor device, for example, the device 100 may have a repeated structure such that the device can be repeated (e.g., along the x axis, the z axis or any other direction) to create an integrated circuit (IC) after finalizing manufacturing processes. In some examples, the semiconductor device may include one or more transistors, which in some embodiments may be fin-like field effect transistors (FinFET) or gate-all-around (GAA) transistors. The dotted line A in FIG. 1A shows the boundary of the semiconductor device 100 that can be repeated along the x axis to form the plurality of semiconductor devices.

In some embodiments, the semiconductor device 100 includes a gate electrode 102 which may extend along a direction (e.g., along the z axis as shown, where the z axis is transverse to the x axis). The semiconductor device 100 includes a plurality of devices, such as one or more transistors, formed on a semiconductor substrate 110. A plurality of isolation trenches 110a-110c extend into the substrate 110. The trenches 110a-110c may have a depth that extends, for example, along the y axis and a width that extends along the z axis, as shown. These trenches 110a-110c may form a plurality of vertical structures (e.g., along the y axis) and may be repeated along a transverse direction (e.g., along the z axis). For example, the trenches 110a-110c may define a plurality of vertical fin-like structures 100a-100d in the substrate. Various embodiments may include any number of trenches and vertical structures which may be selectively designed based on the desired working function of the device or transistor properties such as channel width. Only three trenches 110a-110c are shown in FIG. 1A for simplicity. The vertical structures and the trenches can be symmetrical, e.g., along the z axis. Thus, properties of the cross-sectional cut along the x-y plane may be the same for other vertical structures along the z axis.

Each of the transistors of the semiconductor device 100 may include at least one nanostructure 108, which may be disposed on or over a respective vertical fin-like structure 100a-100d. In some embodiments, as shown in FIG. 1A, each of the vertical fin-like structures 100a-100d may include three nanostructures 108 along the y axis. The transistors further include source/drain regions 112a, 112b, which may be formed of any suitable material, such as a semiconductor material in some embodiments. In some embodiments, the source/drain regions 112a, 112b may be epitaxial structures formed by epitaxial growth of a semiconductor material. The nanostructures 108 may form channel regions of the transistors of the semiconductor device 100, with each transistor including one or more nanostructures 108 forming a channel that extends between neighboring source/drain regions 112a, 112b. Source/drain region(s) may refer to a source or a drain, individually or collectively dependent upon the context. In some embodiments, the epitaxial structure of the source/drain regions 112a, 112b may include a different epitaxial structure in portions which is in a physical contact with the semiconductor material of the substrate 110 and the nanostructures 108 (indicated by dashed line boundaries of the source/drain regions 112a, 112b). In addition, a dopant concentration of the epitaxial structure of the source/drain regions 112a, 112b may have different profile in portions which is in a physical contact with the semiconductor material of the substrate 110 and the nanostructures 108.

In some embodiments, the gate electrode 102 has a height 102a over the nanostructures 108 along the y axis. The nanostructures 108 are surrounded by the gate electrode 102, where the gate electrode 102 is extended inside the trenches 110a-110c. In some examples, a portion of the gate electrode 102 inside the trenches 110a-110c may have a height 102b greater than the height 102a.

Each of the trenches 110a-110c are partially filled with a dielectric material 116. First portions of each of the trenches 110a-110c are filled with the dielectric material 116 having a height 116a along the y axis. The dielectric material 116 inside the trenches provides isolation between the fin-like structures 100a-100d as well as isolation between the gate electrode 102 and substrate 110. A first liner 106b is formed over the first portion of each of the trenches 110a-110c along the y axis (over the dielectric material 116 with the height 116a along the y axis) and is extended along the z axis for each of the trenches 110a-110c. The first liner 106b may be a contact etch stop layer (CESL). A second liner 106a is extended along the z axis for each of the trenches 110a-110c. The second liner 106a may be a contact etch stop layer (CESL). In addition, the second liner 106a is extended over or along a first wall and a second wall (walls 102e and 102w are described in FIG. 1B) of the gate electrode 102. The first liner 106b and the second liner 106a include a dielectric material 106. A bottom surface of the first liner 106b inside each of the trenches 110a-110c along the y axis is curved and contacts spacer structures 114.

A space between the first liner 106b and the second liner 106a is filled with the dielectric material 116, such as a first interlayer dielectric layer (ILD-0), with a height 116b. In addition, a top area of the second liner 106a along the y axis is covered by the dielectric material 116, such as a second interlayer dielectric layer (ILD-1). Hence, the dielectric material 116 enhances electrical isolation between the plurality of devices formed along the x axis. The second liner 106a covers top portions of the source/drain regions 112a, 112b of fin-like structures 100a-100d along the y axis, while second liner 106a is recessed inside of each of the trenches 110a-110c along the y axis. The recess of the second liner 106a in each of the trenches 110a-110c has a distance 116c from the top portion of the source/drain regions 112a, 112b and a distance 116d from a top portion of the dielectric material 116 along the y axis. In some embodiments, the distance 116c is about 3 nm to about 15 nm, while the distance 116d is about 10 nm to about 50 nm. These ranges for the distance 116c may depend on a dimension of the nanostructure 108, where the gate electrode 102 surrounds the nanostructure 108. A dimension lower than 3 nm for the distance 116c may result in an electrical interconnection between the metal sheets of the gate electrode 102 along the y axis. In addition, the distance 116d defines a height of the gate electrode 102 along the y axis. The distance 116d lower than 10 nm may lead to an insufficient electrical contact over the fin-like structures 100a-100d along the y axis.

Figure 1B:
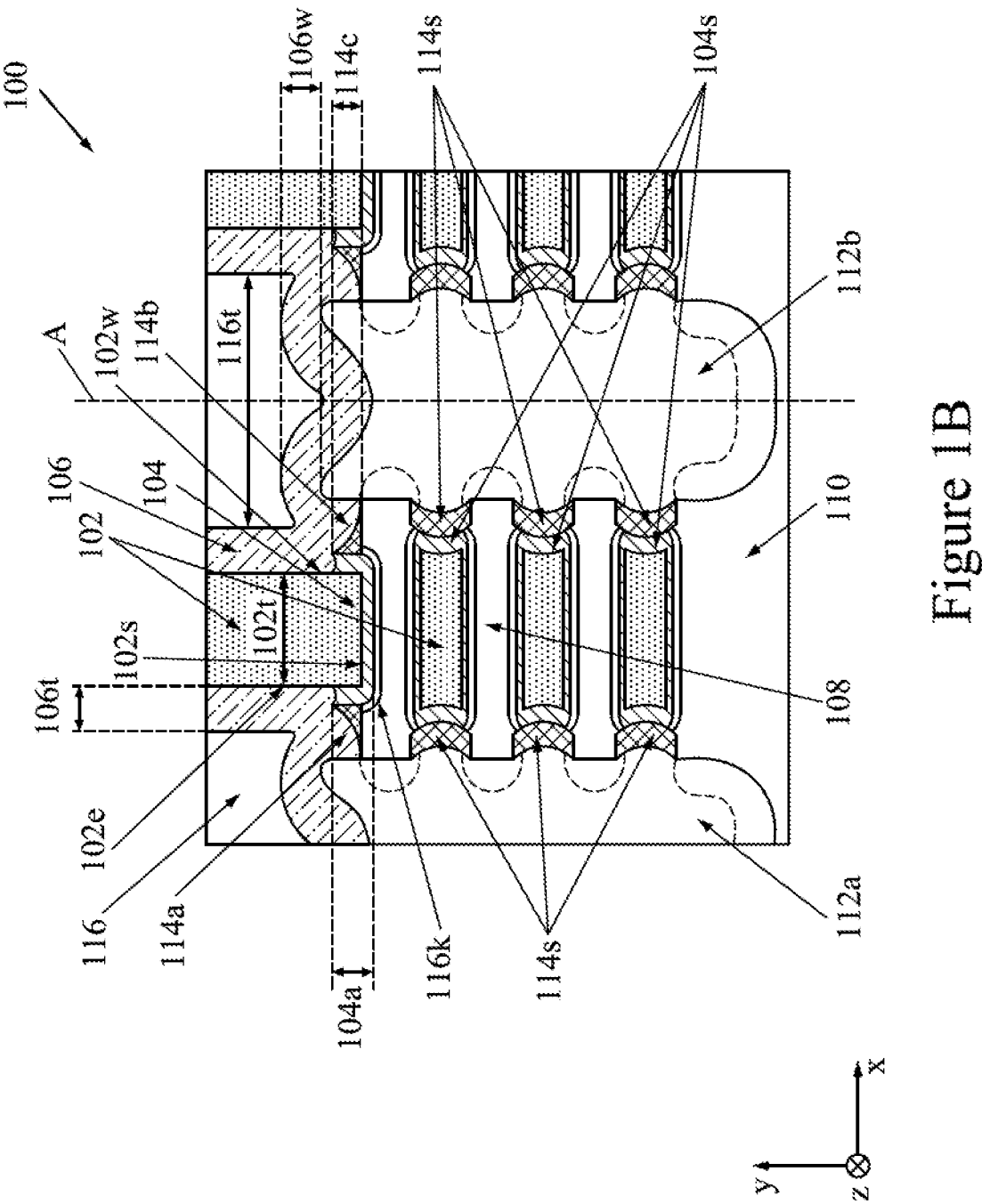
FIG. 1B is a cross-sectional view of the semiconductor device in FIG. 1A, in accordance with some embodiments.

FIG. 1B is a cross-sectional view of the semiconductor device 100 in FIG. 1A. This cross-sectional view shows more detail of the dielectric layers, the nanostructure, and the contacts. The dotted line A indicates the boundary of the semiconductor device 100 that may be repeated along the x axis to form a plurality of devices on a common substrate 110.

In some embodiments, three nanostructures 108 are stacked or overlie or overlap one another along the y axis. In some examples, the number of stacked nanostructures 108 may be more or less than three. In some embodiments, each of the nanostructures 108 is at least partially surrounded by the gate electrode 102. For example, in some embodiments, the gate electrode 102 surrounds at least four sides of each of the nanostructures 108. The nanostructures 108 are coupled between a first source/drain region 112a and a second source/drain region 112b along the x axis. In some examples, the nanostructure 108 is a semiconductor nanosheet, which may be formed by any suitable in semiconductor material. Semiconductor layers of the semiconductor nanosheets may be the same as the semiconductor substrate 110 (e.g., silicon). In some examples, semiconductor materials in the semiconductor nanosheets may be doped with desired dopants to form channel regions of transistors.

Between adjacent ones of the nanostructures 108, portions of the gate electrode 102 (e.g., each of the metal layers of the gate electrode 102) may be surrounded by a high-K (HK) dielectric layer 104s. Sidewalls of each metal layer along the x axis are separated by or spaced apart from the source/drain regions 112a and 112b by gate spacer layers 114s. The spacer layers 114s may be same as the spacers 114 described in FIG. 1A. A top surface and bottom surface of HK dielectric layers 104s for each metal layer are coupled to the semiconductor substrate 110 or to the nanostructures 108 by a thin layer of dielectric material 116. In some examples, the metal layers of the gate electrode 102 form a gate electrode for a gate all around (GAA) transistor, where the source/drain regions 112a and 112b form source/drain regions of the transistor. Thus, a distance between the source/drain regions 112a and 112b define a channel length of the transistor. In this fashion, the HK dielectric 104s is a gate dielectric for the transistor.

The gate electrode 102 extends between the nanostructures 108, and may also include a portion that overlies the nanostructures 108, e.g., along the y axis. In some embodiments, a bottom surface 102s of an upper portion of the gate electrode 102 is coupled to the uppermost nanostructure 108 along the y axis. An HK dielectric 104 is between the surface 102s and the nanostructure 108 to form a gate dielectric layer. In some embodiments, an interfacial layer 116k is between the HK dielectric 104 and the semiconductor substrate 110. The HK dielectric 104 covers a portion of a first wall 102e and a portion of a second wall 102w of the gate electrode 102 along the x direction. The HK dielectric 104 has a height 104a on the first wall 102e and the second wall 102w along the y axis. A spacer 114a is disposed between the HK dielectric 104 on the first wall 102e and the source/drain region 112a, and a spacer 114b is disposed between the HK dielectric 104 on the second wall 102w and the source/drain region 112b. The spacer 114a and the spacer 114b may have a same height 114c along the y axis at the portions that are in contact with the HK dielectric 104. The height of the spacer 114a is gradually reduced by moving from the HK dielectric 104 toward the source/drain region 112a along the x axis. In a similar fashion, the height of the spacer 114b is gradually reduced by moving from the HK dielectric 104 toward the source/drain region 112b along the x axis. In some examples, the height 104a is greater than the height 114c. The heights 104a and 114c may be in a range between 1 nm to 10 nm. Heights lower than about 1 nm may lead to an insufficient isolation along the x axis. Heights above about 10 nm may cause unnecessary material consumption along the y axis while the dielectric material 106 is in contact with the gate electrode 102. A dimension 102t of the gate electrode along the x axis defines the channel length of the transistor. The dimension 102t may be the same for the metal layer stacks between the nanostructures 108 along the x axis.

The dielectric material 106 covers a portion of the first wall 102e along the x axis, a portion of the second wall 102w along the x axis, top portions of the HK dielectric 104 on the first wall 102e and the second wall 102w along the y axis, top portions of the spacers 114a and 114b along the y axis, and top portions of the source/drain regions 112a and 112b along the y axis. In this fashion, the dielectric material 106 on the source/drain regions 112a and 112b is extended over the trenches 110a-110c of FIG. 1A in the same manner as the second liner 106a described above in FIG. 1A. An area over the dielectric material 106 along the y axis is covered by the dielectric material 116, such as the second interlayer dielectric layer (ILD-1) described in FIG. 1A. The dielectric material 116 may fill an area between two gate electrodes of two adjacent semiconductor devices along the x axis. For instance, a dimension 116t along the x axis over the source/drain region 112b along the y axis is filled with the dielectric material 116. The dimension 116t may be repeated between the gate electrodes of the plurality of devices arranged along the x axis. The dielectric material 106 of the second liner 106a has a thickness 106w along the y axis and a thickness 106t along the x axis. In some examples, the thickness 106w is same as the thickness 106t. In some embodiments, the dimension 116t is greater than the dimension 102t, and the dimension 102t is greater than the dimension 106t. The source/drain regions 112a and 112b have a concave surface along the y axis, where the boundary between the two adjacent devices has a recess along the y axis compared with sides of the source/drain regions along the x axis. In some examples, the dielectric materials 116 and 106 on top of this concave portion along the y axis may be trenched to form source/drain contacts, which may be referred to herein as metal-to-device (MD) contacts (not shown in FIGS. 1A-1B). The MD contacts generally refer to a conductive region coupled to source/drain (S/D) regions 112a and 112b of the transistor. In various embodiments, the conductive region coupled to source/drain (S/D) regions 112a and 112b of the transistor may be a material different than metal or a metal alloy. In a similar fashion, the gate electrode 102 may be a metal gate (MG) electrode of the transistor. In some examples, the source/drain regions 112a and 112b may be n-type/p-type epitaxial layers to form source or drain regions on the substrate 110. The dielectric materials 106, 116, the HK dielectric 104, and the spacer 114 provide an electrical isolation between the MG and MD of the semiconductor device 100 to reduce electrical leakage when the dimensions of the semiconductor devices are scaled down.

HK dielectric material has a dielectric constant (k) higher than that of silicon dioxide. Examples of HK dielectric materials include hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-k material, or a combination thereof. In some embodiments, the conductive material of the gate electrode 102 for MG contacts, the metal layers of the gate electrode 102 between the nanostructures 108, and MD contacts include aluminum (Al), copper (Cu), tungsten (W), titanium (Ti), tantalum (Ta), or another applicable material. The source/drain regions 112a and 112b may be formed of Si, Ge, SiP, SiC, SiPC, SiGe, SiAs, InAs, InGaAs, InSb, GaAs, GaSb, InAlP, InP, C, or a combination thereof. In some examples, the spacers 114 and the dielectric material 106 can be selected from SiN, SiOx, SiCN, SiON, and SiOCN. In this fashion, a dielectric constant of the dielectric material 106 may be less than a dielectric constant of the HK dielectric material. The dielectric material 116 may include silicon oxide, silicon nitride, silicon oxynitride, TEOS formed oxide, PSG, BPSG, low-k dielectric material, or combinations thereof. Exemplary low-k dielectric materials include fluorinated silicon glass (FSG), carbon doped silicon oxide, silica based dielectric materials such as SiOC: H, Xerogel, Aerogel, amorphous fluorinated carbon, Parylene, benzocyclobutene (BCB), organic polymer dielectric materials, polyimide, other low-k dielectric material, or combinations thereof.

Figure 2A:
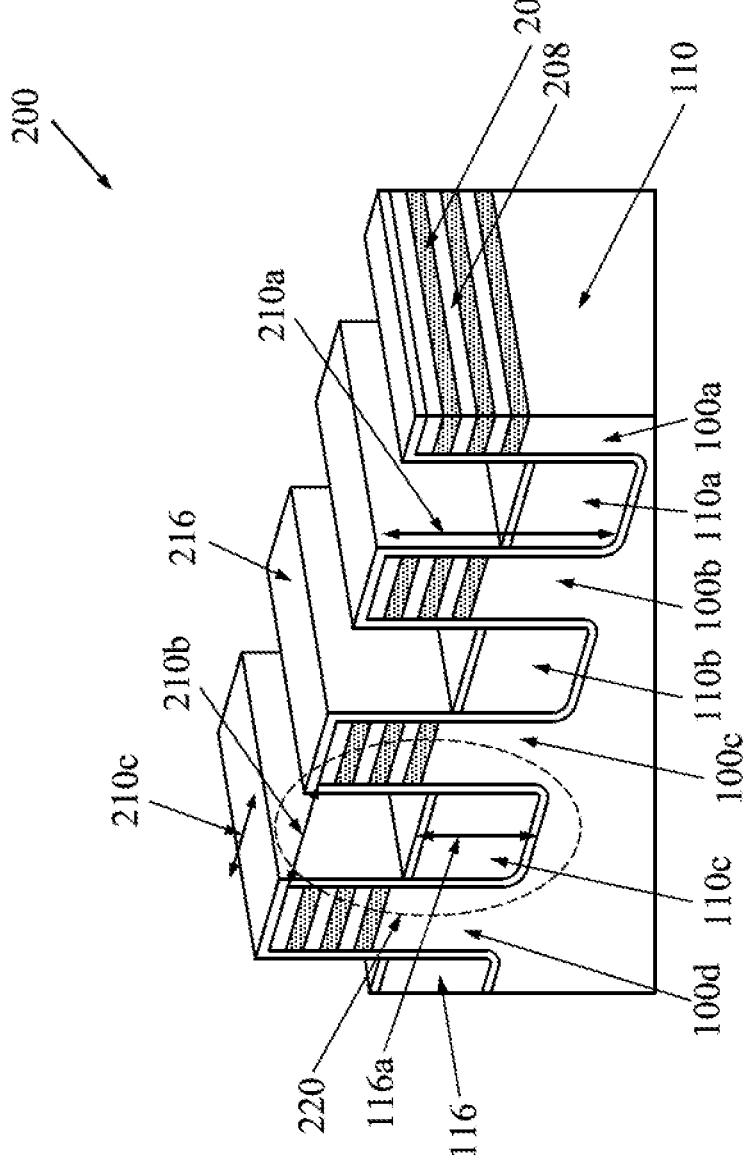
FIGS. 2A-2C are views illustrating a semiconductor device at various stages of manufacturing the semiconductor device in FIG. 1A, in accordance with some embodiments.
Figure 2A:
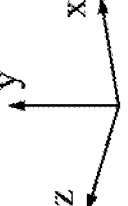
Figure 2B:
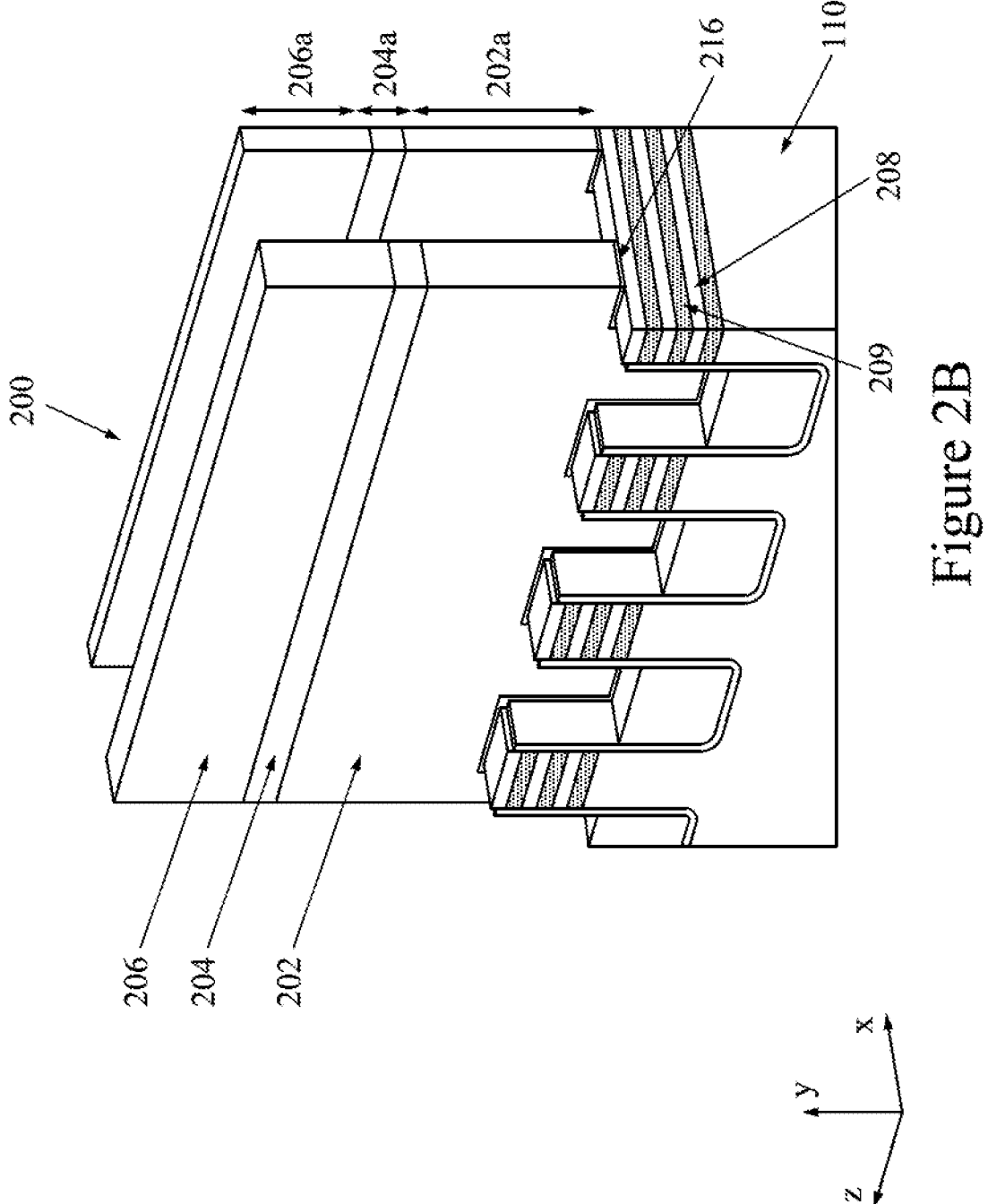
Figure 2C:
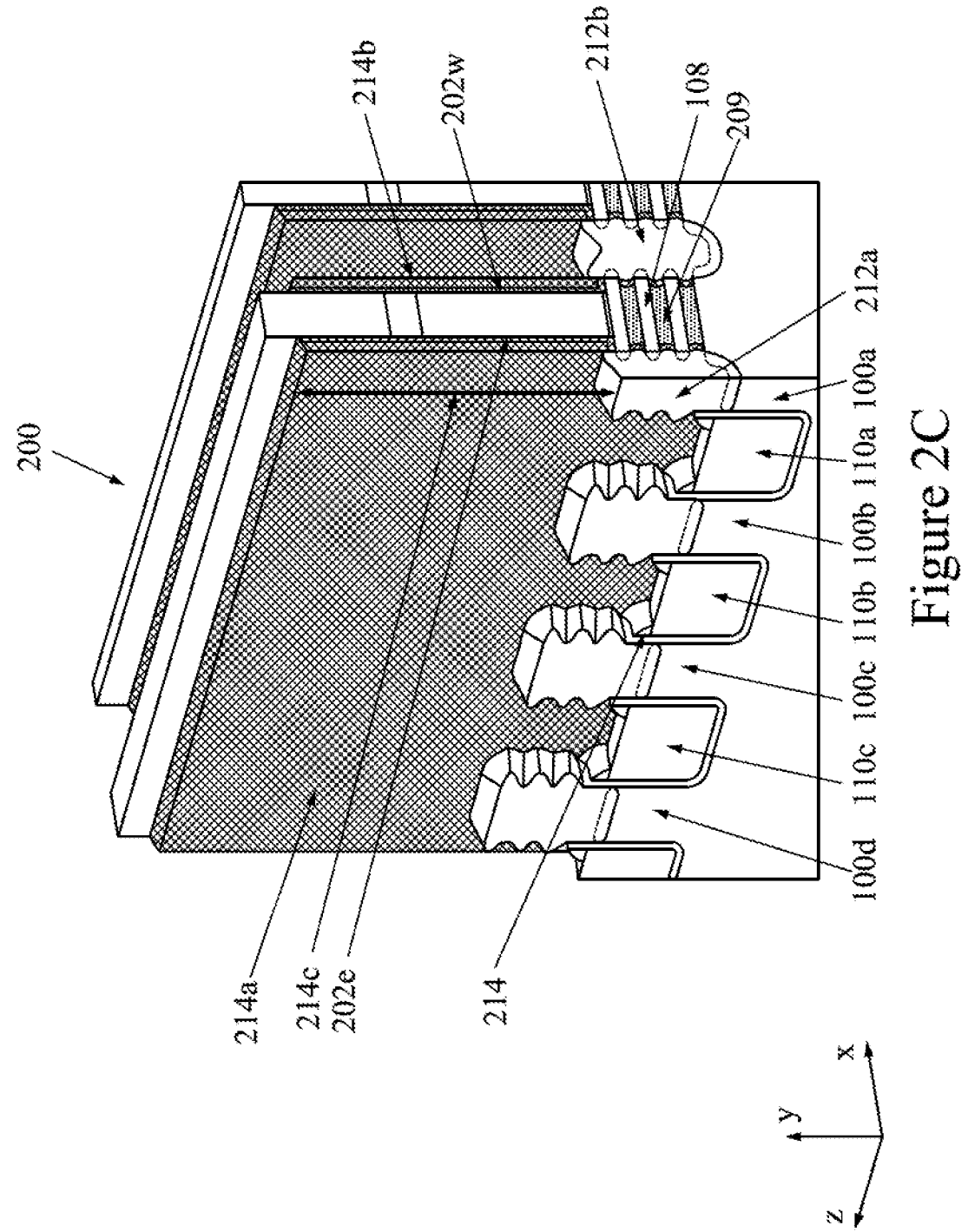

FIGS. 2A-2C are various stages of manufacturing the semiconductor device 100 in FIGS. 1A-1B. The same reference numbers are used for such components that are described in FIGS. 1A-1B for simplicity. FIG. 2A is a stage of manufacturing the trenches and some insulating portions described above in FIGS. 1A-1B. A number of trenches along the z axis and dimensions of the trenches along the x axis may be designed based on desired characteristics of the semiconductor devices (e.g., device 100 in FIGS. 1A-1B).

In some embodiments, the trenches 110a-110c are formed in the semiconductor substrate 110 with a depth 210a along the y axis and a dimension 210b along the z axis. The dimensions described for each trench of the trenches 110a-110c may be same for all the trenches 110a-110c. Although only three trenches 110a-110c are described here, the number of trenches may be more than three or less than three for various embodiments. The trenches 110a-110c define fin-like structures 100a-100d of the semiconductor substrate 110, where each of the fin-like structures 100a-100d is formed between the two adjacent trenches of the trenches 110a-110c. Each of the fin-like structures 100a-100d has a dimension 210c along the z axis. Each of the vertical fin-like structures 100a-100d includes a plurality of semiconductor nanosheets 208 stacked along the y axis. The semiconductor nanosheets 208 may be further processed by any suitable technique to form the nanostructures 108 of FIG. 1A, for example, by any photolithographic process, etching, or the like. In this fashion, three semiconductor nanosheets 208 are stacked between sacrificial layers 209 (e.g., SiGe). The sacrificial layers 209 will later be removed and replaced with the gate electrode 102 described in FIG. 1B. Different numbers of the stacked semiconductor nanosheets 208 and sacrificial layers 209 may be designed based on the desired characteristics of the semiconductor devices. In some examples, the trenches 110a-110c may be formed by an etching process. The stacked semiconductor nanosheets 208 and sacrificial layers 209 may be formed with different deposition techniques before the etching process. Semiconductor layers of the semiconductor nanosheets 208 may be the same as the semiconductor substrate 110. In some examples, semiconductor materials in fin-like structures 100a-100d, e.g., in the semiconductor nanosheets 208, may be doped with desired dopants to change electrical characteristic of the fin-like areas that may form channel regions of transistors.

Fin-like structures 100a-100d may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern fin-like structures 100a-100d.

After forming the trenches 110a-110c, a dielectric layer 216 is formed on the fin-like structures 100a-100d to cover top portions of the fin-like structures 100a-100d along the y axis, sidewalls of the fin-like structures 100a-100d along the z axis, and beds of the trenches 110a-110c along the y axis. In this fashion, the dielectric layer 216 forms a dummy gate dielectric layer in top portions of the fin-like structures 100a-100d, while it forms a liner on the bed of the trenches 110a-110c. In some embodiments, dielectric layer 216 is disposed conformally on top and sidewall surfaces of fin-like structures 100a-100d. The term "conformally" may be used herein for ease of description for a layer having substantially the same thickness over various regions. In some examples, dielectric layer 216 may be formed by depositing a dielectric material using processes such as a chemical vapor deposition (CVD) process, a sub-atmospheric CVD (SACVD) process, a flowable CVD process, an atomic layer deposition (ALD) process, a physical vapor deposition (PVD) process, or other suitable process. In some embodiments, dielectric layer 216 is an oxide layer (e.g., SiO2) formed by oxidizing exposed surfaces of fin-like structures 100a-100d and substrate 110. The oxidation process results in the oxide layer having a determined thickness. For example, the oxide layer may have a thickness from about 1 nm to about 5 nm. Thickness lower than about 1 nm may lead to electrical shorting with the nanostructures 108. Thickness above about 5 nm may cause excessive electrical isolation between the gate electrode 102 and the nanostructure 108 in FIG. 1B. In some embodiments, the oxidation process comprises a rapid thermal oxidation (RTO) process, high pressure oxidation (HPO), chemical oxidation process, in-situ stream generation (ISSG) process or enhanced in-situ stream generation (EISSG) process. Next, the dielectric material 116 fills a portion of each trench 110a-110c. A height of the filling along the y axis is same as the height 116a described in FIG. 1A. In this stage, each trench 110a-110c is filled with the dielectric material 116 until a boundary of the semiconductor nanosheets 208 and sacrificial layers 209, while a portion of trenches 110a-110c between the semiconductor nanosheets 208 and sacrificial layers 209 along the z axis is empty. In this fashion, the filled portions isolate adjacent fin-like structures 110a-100d from each other along the z axis and isolate an active area that will be formed in the empty area from the substrate 110.

In various embodiments, the trenches 110a-110c and the dielectric material 116 inside the trenches 110a-110c form an isolation feature 220. The isolation feature 220 is formed over and/or in substrate 110 to isolate various regions, such as various device regions, of device 200. The isolation feature 220 separates and isolates fin-like structures 100a-100d from one another. Particularly, the isolation feature 220 surrounds a bottom portion of fin-like structures 100a-100d, while a top portion of fin-like structures 100a-100d protrudes from isolation feature 220. The isolation feature 220 may include different structures, such as shallow trench isolation (STI) structures, deep trench isolation (DTI) structures, and/or local oxidation of silicon (LOCOS) structures. In some implementations, STI features can be formed by depositing an insulator material over substrate 110 after forming fin-like structures 100a-100d, such that the insulator material layer fills trenches 110a-110c between fin-like structures 100a-100d, and etching back the insulator material layer to form isolation feature 220. In some implementations, the isolation feature 220 includes a multi-layer structure that fills trenches 110a-110c, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some implementations, the isolation feature 220 includes a dielectric layer disposed over a doped liner layer (including, for example, boron silicate glass (BSG) or phosphosilicate glass (PSG)).

FIG. 2B is a stage of manufacturing poly-gate structures as a dummy feature that can be removed after some stages of manufacturing. Poly-gate structures may be in a same size of the gate electrode 102 along the x axis and the z axis. A number of poly-gate structures may be repeated along the x axis based on a number of devices to be formed on the substrate 110.

In various embodiments, each of the poly-gate structures includes a dummy gate 202, a first mask 204, and a second mask 206 stacked along the y axis. The dummy gate 202 fills the empty portions of the trenches 110a-110c to surround semiconductor nanosheets 208 and sacrificial layers 209 of the fin-like structures 100a-100d described in FIG. 2A. The dummy gate 202 has a height 202a from top portions of the fin-like structures 100a-100d along the y axis. The first mask 204 is formed on the dummy gate 202 with a height 204a along the y axis. The second mask 206 is formed on the first mask 204 with a height 206a along the y axis. In some examples, the height 202a is greater than the height 206a, and the height 206a is greater than the height 204a. A width of the dummy gate 202, the first mask 204, and the second mask 206 may be same along the x axis. The width of the dummy gate 202 along the x axis may be same as the dimension 102t described in FIG. 1B. In some examples, the first mask 204 may be a photoresist soft mask while the second mask 206 is a hard mask material for etching process. The hard mask material may include polysilicon. The polysilicon hard mask can include a suitable hard mask material, including SiO, SiN, or SiCN.

The poly-gate structures cover portions of the dielectric layer 216 described in FIG. 2A. In this fashion, the portions of the dielectric layer 216 between the dummy gate 202 and the semiconductor nanosheets 208 forms dummy gate dielectric layers. The portions of the dielectric layer 216 on the fin-like structures 100a-100d along the y axis, that are not covered by the dummy gate 202 along the x axis, may be removed by an etching process. The etching process may include any suitable etching technique such as wet etching, dry etching, RIE, ashing, and/or other etching methods. In some embodiments, etching includes multiple etching steps with different etching chemistries, each targeting a particular material and each selected to resist etching the first mask 204 or the second mask 206. For example, a dry etching process may implement an oxygen containing gas, a fluorine-containing gas (e.g., $CF_4$, SF, CH, $F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchants.

FIG. 2C is a stage of manufacturing spacer layers on sidewalls of the poly-gate structures along the x axis. In addition, source/drain regions are formed on the portions of fin-like structures 100a-100d. The spacers correspond to the spacers 114 in FIG. 1A, and the source/drain regions correspond to the source/drain regions 112a, 112b in FIG. 1A.

In some embodiments, spacers 214a and 214b are formed on first and second sidewalls 202e, 202w of the poly-gate structure along the x axis, respectively, where each dummy gate 202 is enclosed between two spacers 214a and 214b along the x axis. A height 214c of the spacers 214a and 214b from the top portions of the fin-like structures 100a-100d is greater than a summation of the heights 202a and 204a. The height 214c is less than a total height of the poly-gate structure along the y axis that is a summation of the heights 202a, 204a, and 206a. In some examples, the spacers 214a and 214b are made of silicon nitride, silicon oxynitride, silicon carbide, another suitable material, or a combination thereof. Portions of fin-like structures 100a-100d that are not covered by dummy gate 202 and spacers 214a and 214b serve as a drain region 212a/212b and a source region 212b/212a (refers to source/drain regions hereinafter).

In some embodiments, the source/drain regions 212a/212b are epitaxially grown from epitaxial material(s). In some embodiments, the source/drain regions 212a/212b exert stress in the respective nanostructures 108, thereby improving performance. The source/drain regions 212a/212b are formed such that each dummy gate 202 is disposed between respective neighboring pairs of the source/drain regions 212a/212b. In some embodiments, the spacers 214a and 214b separate the source/drain regions 212a/212b from the dummy gate 202 by an appropriate lateral distance to prevent electrical bridging to subsequently formed gates of the resulting device.

In some embodiments, the nanostructures 108 are formed by etching portions of fin-like structures 100a-100d, that are not covered by dummy gate 202 and spacers 214a and 214b, to form recess regions and forming epitaxial regions in the recess regions. In some examples, corners of the trenches 110a-110c over the dielectric material 116 along the y axis are partially filled with spacer material 214 to form the spacers 114 described in FIG. 1A. The epitaxial regions may be formed of Si, Ge, SiP, SiC, SiPC, SiGe, SiAs, InAs, InGaAs, InSb, GaAs, GaSb, InAlP, InP, C, or a combination thereof. In some examples, source/drain regions 212a/212b may be formed of silicon germanium (SiGe), while the remaining fin-like structures 100a-100d may be formed of silicon. In some embodiments, p-type impurities are in-situ doped in source/drain regions 212a/212b during the epitaxial growth of source/drain regions 212a/212b. In some examples, n-type impurities are in-situ doped in source/drain regions 212a/212b during the epitaxial growth of source/drain regions 212a/212b.

Figure 3A:
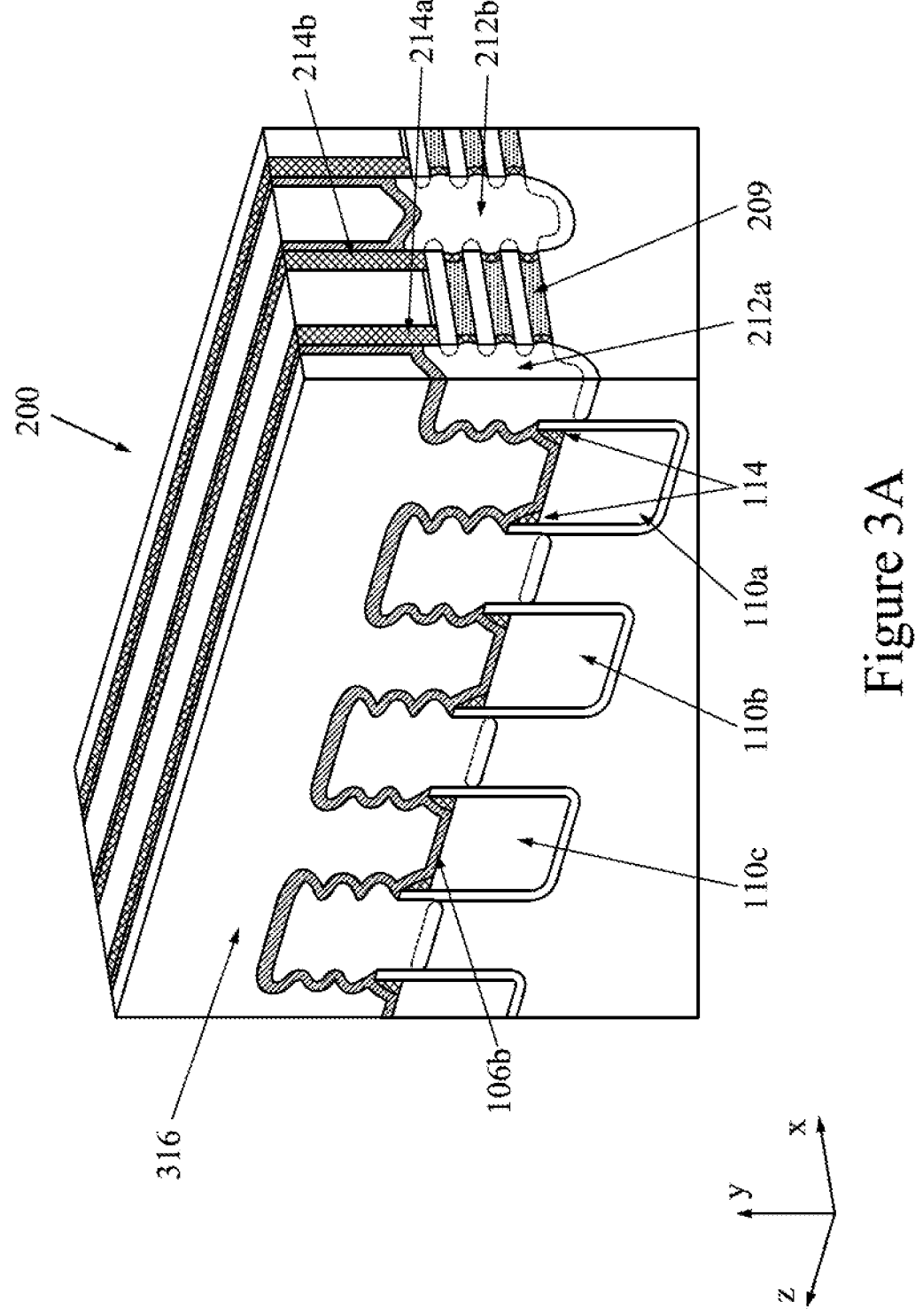

FIG. 3A is the device 200 of FIG. 2C after processing some stages of manufacturing. In this stage the first liner 106b is formed and the remaining portions of the trenches 110a-110c and the top portions of the fin-like structures 100a-100d along the y axis are filled with the dielectric material 116 as the first interlayer dielectric (ILD-0) which is described in FIG. 1A. A portion of the poly-gate structure and spacers 214a and 214b that are described in FIG. 2C are removed along the y axis.

In some embodiments, the first liner 106b is deposited on sidewalls of spacers 214a and 214b in FIG. 2C and the source/drain regions 212a and 212b in trenches 110a-110c. The first liner 106b may include a dielectric material, such as titanium nitride, silicon nitride, or titanium oxide as well as the dielectric material 106 described in FIG. 1B. The first liner 106b may be formed by various processes, including a deposition process and an etching process. For instance, the deposition process may include thermal growth, CVD, PVD, and ALD. The deposition process may include depositing the first liner 106b as a conformal layer. In this fashion, the blanket layer includes silicon nitride and is deposited by a conformal deposition technique, such as an ALD process. In some examples, the etching process may include an anisotropic etch such as plasma etch. The anisotropic etch removes the majority of the horizontal portions of the blanket layer along the z axis, while vertical portions of the blanket layer along the y axis remain on the sidewalls of spacers 214a and 214b and source/drain regions 212a and 212b. A portion of the spacer material 114 that is deposited in the corners of trenches 110a-110c over the dielectric material 116 as described in FIG. 2C, causes a curved shape of the first liner 106b at the corners of each trench of the trenches 110a-110c. The spacer material 114 provides a smooth shape of the first liner 106b in the corners of the trenches 110a-110c that is beneficial for the contact etch stop layer (CESL) application of the first liner 106b. In this fashion, the first liner 106b may be conformally deposited on a bed of the trenches 110a-110c that is shaped as a half-hexagonal instead of straight corner.

In some embodiments, a dielectric layer 316 (ILD-0) may be formed on the first liner 106b by the dielectric material 116 as described in FIG. 1B. In some examples, dielectric layer 316 is formed over the first liner 106b by a deposition process, such as CVD, PVD, ALD, HDPCVD, MOCVD, RPCVD, PECVD, LPCVD, ALCVD, APCVD, or combinations thereof. In some implementations, dielectric layer 316 is formed by a flowable CVD (FCVD) process that includes, for example, depositing a flowable material (such as a liquid compound) over the first liner 106b and converting the flowable material to a solid material by a suitable technique, such as thermal annealing and/or ultraviolet radiation treating. In some embodiments, after deposition of the dielectric layer 316, the deposited dielectric material is thinned and planarized, for example, by a chemical mechanical polishing (CMP) process. In this fashion, a portion of the spacers 214a, 214b, the first mask 204, the second mask 206, and a portion of dummy gate 202 are etched and polished to be planarized with the dielectric layer 316 along the y axis.

FIG. 3B is the device 200 after replacing the dummy gate 202 with a gate electrode 302 and high-k (HK) dielectric 304. The gate electrode 302 and HK dielectric 304 correspond to the gate electrode 102 and gate dielectric 104, respectively in FIG. 1A.

In various embodiments, the dummy gate 202 is removed to form gate trenches (not shown). Subsequent processes may form contact openings, contact metal, as well as various contacts/vias/lines and multilayer interconnect features (e.g., metal layers and interlayer dielectrics) on the gate trenches, configured to connect the various features to form a functional circuit that may include one or more memory devices. In some examples, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. The gate electrode 302 includes an in electrically conductive material. In some implementations, the gate electrode 302 includes multiple layers, such as a capping layer, a work function layer, a glue/barrier layer, and a metal fill (or bulk) layer. In some examples, the capping layer may include tungsten (W), cobalt (Co), molybdenum (Mo), ruthenium (Ru), nickel (Ni), copper (Cu), or other metals, and may be formed by CVD, PVD, ALD, plating, or other suitable processes. The gate electrode 302 further includes respective gate dielectric 304 disposed along sidewalls of the respective gate stacks between nanostructures 108. The gate dielectric 304 is an HK dielectric as described in FIG. 1B. In addition, spacers 314a and 314b are portions of the spacers 214a and 214b in FIG. 3A that are remained after replacing dummy gate 202 with the gate electrode 302 and high-k (HK) dielectric 304.

Figure 3C:
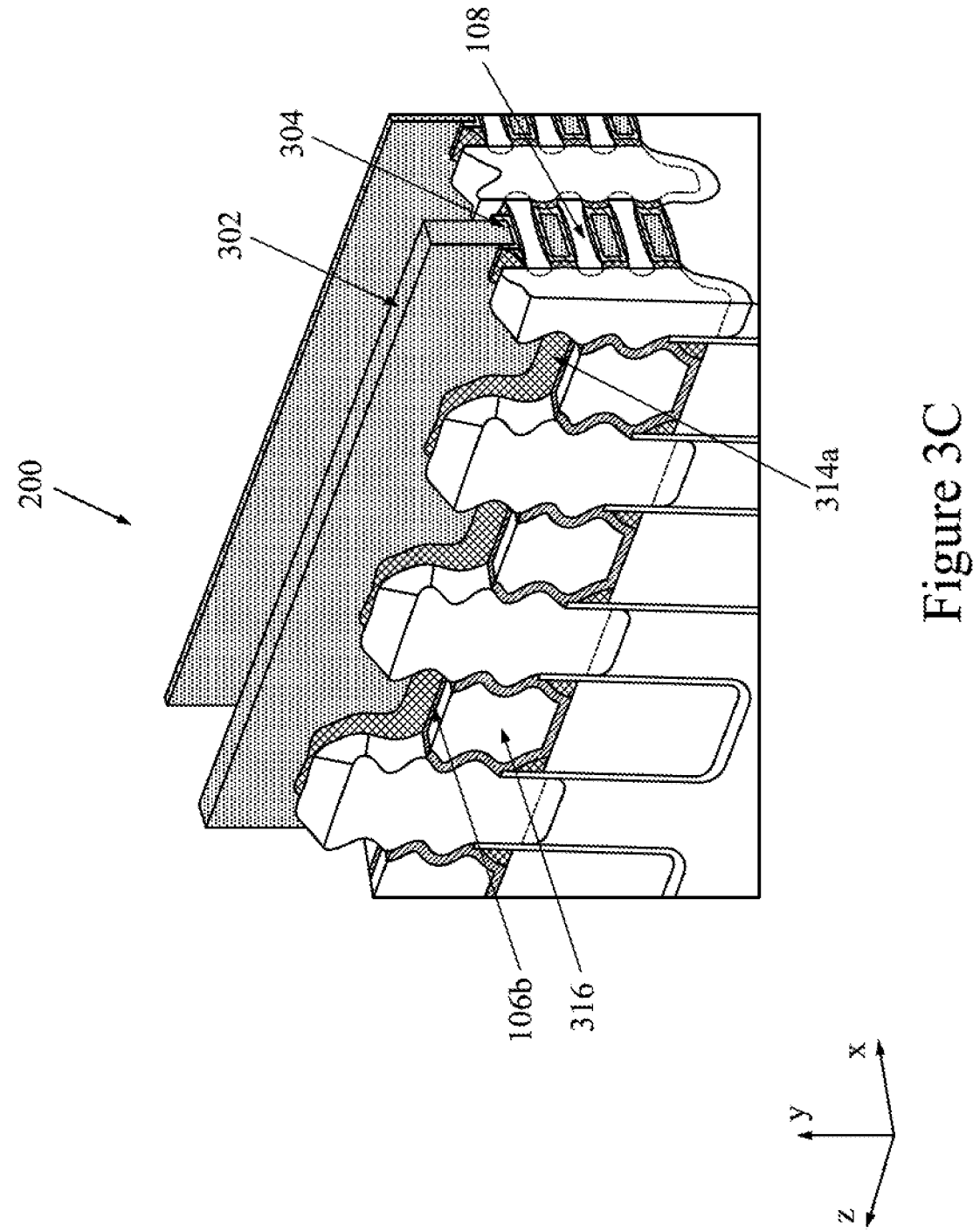

FIG. 3C is an etching back process to remove upper portions of the first liner 106b, a portion of dielectric layer 316, the gate spacers 314a and 314b (not shown), and the HK dielectric 304 from the gate electrode 302. In some examples, the etching process may include an anisotropic etch such as plasma etch. The anisotropic etch removes the majority of the horizontal portions of dielectric layer 316, the gate spacers 314a and 314b, and the HK dielectric 304 along the z axis and the x axis. A vertical recess of the HK dielectric 304 along the y axis, that corresponds to the HK dielectric 104 described in FIG. 1B, provides sidewalls area of the gate electrode 302 (e.g., sidewalls 102e and 102w in FIG. 1B) to be in direct contact with the dielectric layer 106 described in FIG. 1B.

In some embodiments, the horizontal portions of dielectric layer 316, the gate spacers 314a and 314b, and the HK dielectric 304 may be etched by various methods, including a dry etch, a wet etch, or a combination of dry etch and wet etch. The dry etching process may implement fluorine-containing gas (e.g., $CF_4$, $SF_6$, $CH_2F_2$, $CHF_3$, and/or $C_4F_8$), chlorine-containing gas (e.g., $Cl_2$, $CHCl_3$, $CCl_4$, and/or $BCl_3$), bromine-containing gas (e.g., HBr and/or $CHBr_3$), oxygen-containing gas, iodine-containing gas, other suitable gases and/or plasmas, or combinations thereof. The etching process may include a multiple step etching to gain etch selectivity, flexibility and desired etch profile. In some examples, a bias voltage of the plasma etching is controlled to selectively etch the portions of dielectric layer 316, the gate spacers 314a and 314b, and the HK dielectric 304 while the gate electrode 302 and the metal gate stacks between the nanostructures 108 remain undamaged. In this fashion, a bias voltage greater than 10 V may damage the gate electrode 302 and the metal gate stacks between the nanostructures 108. Thus, the bias voltage of the plasma etching process is controlled to be less than 10 V.

Figure 3D:
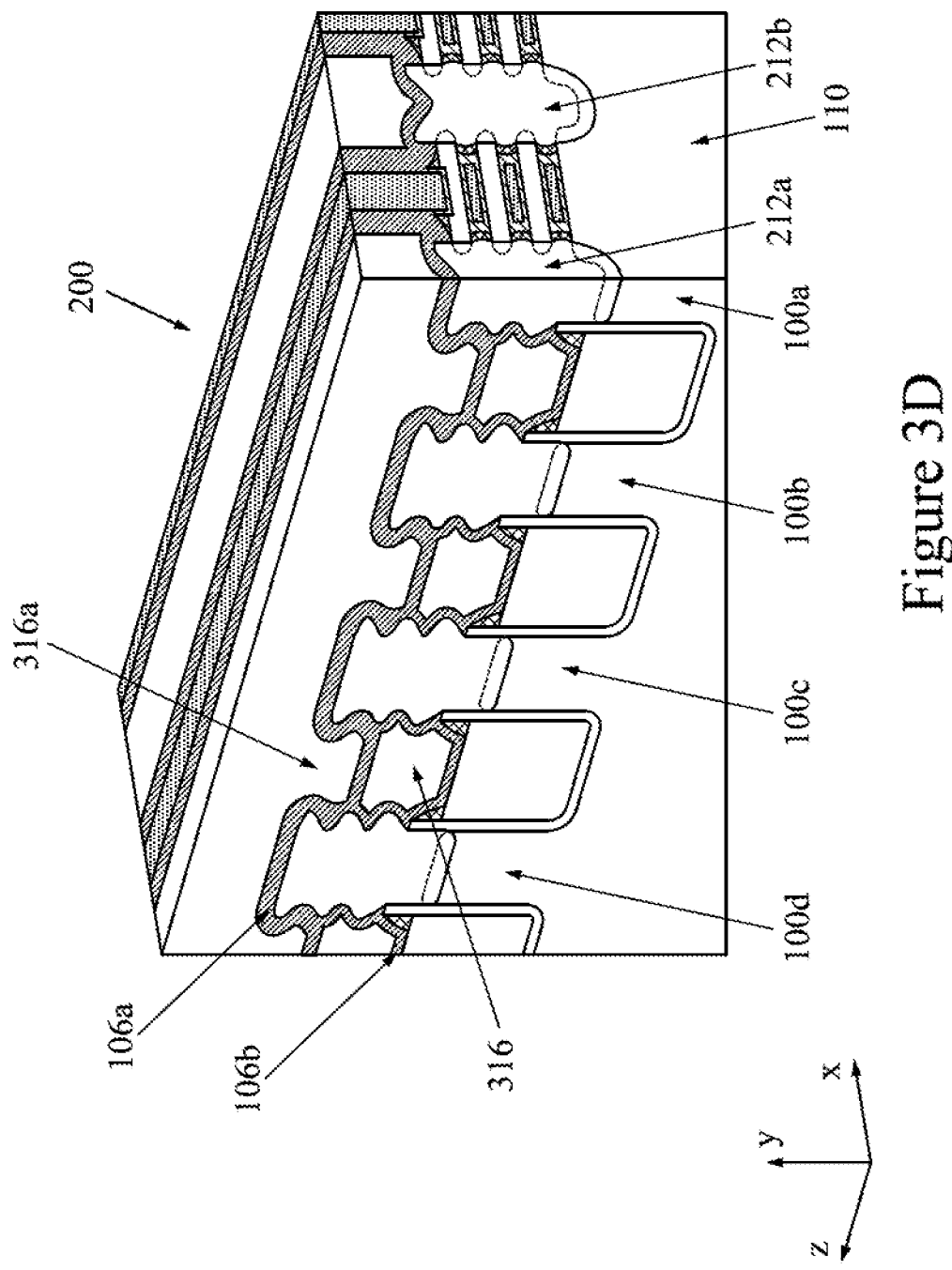

FIG. 3D corresponds to FIG. 1A, where the second liner 106*a* is formed on the area that is etched back in the stage of FIG. 3C. A second interlayer dielectric (ILD-1) fills the second liner 106*a* and a surface of the device along the y axis is planarized with a CMP process.

In some embodiments, the second liner 106*a* may be a CESL the same as the first liner 106*b*. In a similar fashion to the stage described in FIG. 3A, the second liner 106*a* may include a dielectric material, such as titanium nitride, silicon nitride, or titanium oxide as well as the dielectric material 106 described in FIG. 1B. The second liner 106*a* may be formed by various processes, including a deposition process and an etching process. For instance, the deposition process may include thermal growth, CVD, PVD, and ALD. The deposition process may include depositing the second liner 106*a* as a blanket layer. In this fashion, the blanket layer includes silicon nitride and is deposited by a conformal deposition technique, such as an ALD process. In some examples, the second liner 106*a* can be conformally deposited on sidewalls of the gate electrode 302, over source/drain regions 212*a* and 212*b*, and over dielectric layer 316 along the y axis. In addition, the dielectric material 106 re-fills the top portion of the HK dielectric 304 that is recessed from the sidewalls of the gate electrode 302. Hence, the dielectric material 106 is in direct contact with the HK dielectric 304, the spacers 314*a* and 314*b*, and sidewalls of the gate electrode 302.

In some embodiments, a dielectric layer 316*a* (ILD-1) may be formed on the second liner 106*a* in the same way as the step of forming dielectric layer 316 described in FIG. 3A. In this fashion, dielectric layer 316*a* may be formed by the dielectric material 116 as described in FIG. 1B. In some examples, dielectric layer 316*a* is formed over the second liner 106*a* by a deposition process, such as CVD, PVD, ALD, HDPCVD, MOCVD, RPCVD, PECVD, LPCVD, ALCVD, APCVD, or combinations thereof. In some implementations, dielectric layer 316*a* is formed by a flowable CVD (FCVD) process that includes, for example, depositing a flowable material (such as a liquid compound) over the second liner 106*a* and converting the flowable material to a solid material by a suitable technique, such as thermal annealing and/or ultraviolet radiation treating. In some embodiments, after deposition of the dielectric layer 316*a*, the deposited dielectric material is thinned and planarized, for example, by a chemical mechanical polishing (CMP) process. In this embodiment, a portion of the gate electrode 302 and the second liner 106*a* are etched and polished to be planarized with the dielectric layer 316*a* along the y axis.

In some embodiments, fin-based multi-gate transistor 200 (corresponding to device 100 in FIG. 1A) is a GAA transistor that includes a fin-like structure having vertically-stacked horizontally-oriented channel layers (e.g., nanowires or nanosheets). In some embodiments, semiconductor substrate 110 and fin-like structures 100*a*-100*d* are made of the same material. For example, the substrate 110 is a silicon substrate. In some instances, the substrate 110 includes a suitable elemental semiconductor, such as germanium or diamond; a suitable compound semiconductor, such as silicon carbide, gallium nitride, gallium arsenide, or indium phosphide; or a suitable alloy semiconductor, such as silicon germanium, silicon tin, aluminum gallium arsenide, or gallium arsenide phosphide. In some embodiments, the substrate is a silicon on insulator (SOI) layer substrate or a silicon on sapphire (SOS) substrate. In some embodiments, semiconductor substrate 110 and fin-like structures 100*a*-100*d* are made of different materials.

In some embodiments, semiconductor material is epitaxially grown on fin-like structures 100*a*-100*d*, forming epitaxial source/drain (S/D) 212*a*, 212*b* of the fin 100*a* (that are repeated for all the fins 100*b*-100*d*). In some implementations, epitaxial S/D are formed over the S/D regions of fin-like structures 100*a*-100*d* after a fin recess process, such that epitaxial S/D are grown from recessed fin-like structures 100*a*-100*d*. In some implementations, epitaxial S/D wrap the S/D regions of fin-like structures 100*a*-100*d*. In such implementations, fin-like structures 100*a*-100*d* may not be recessed. An epitaxy process may implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process may use gaseous and/or liquid precursors, which interact with the composition of substrate 110. In some examples, epitaxial S/D are doped with n-type dopants and/or p-type dopants. Epitaxial S/D 212*a* and 212*b* over the same well (e.g., n-well or p-well) are oppositely doped. For example, for doping with p-type dopant, epitaxial S/D may be silicon germanium containing epitaxial layers that are doped with boron, carbon, other p-type dopant, or combinations thereof (for example, forming a Si:Ge:B epitaxial layer or a Si:Ge:C epitaxial layer). For doping with n-type dopant, epitaxial S/D may be silicon-containing epitaxial layers or silicon-carbon-containing epitaxial layers that are doped with phosphorous, arsenic, other n-type dopant, or combinations thereof (for example, forming a Si:P epitaxial layer, a Si:C epitaxial layer, or a Si:C:P epitaxial layer). In some implementations, epitaxial S/D are doped by an ion implantation process subsequent to a deposition process. In some implementations, annealing processes are performed to activate dopants in epitaxial S/D.

Figures 4A, 4B, 4C:
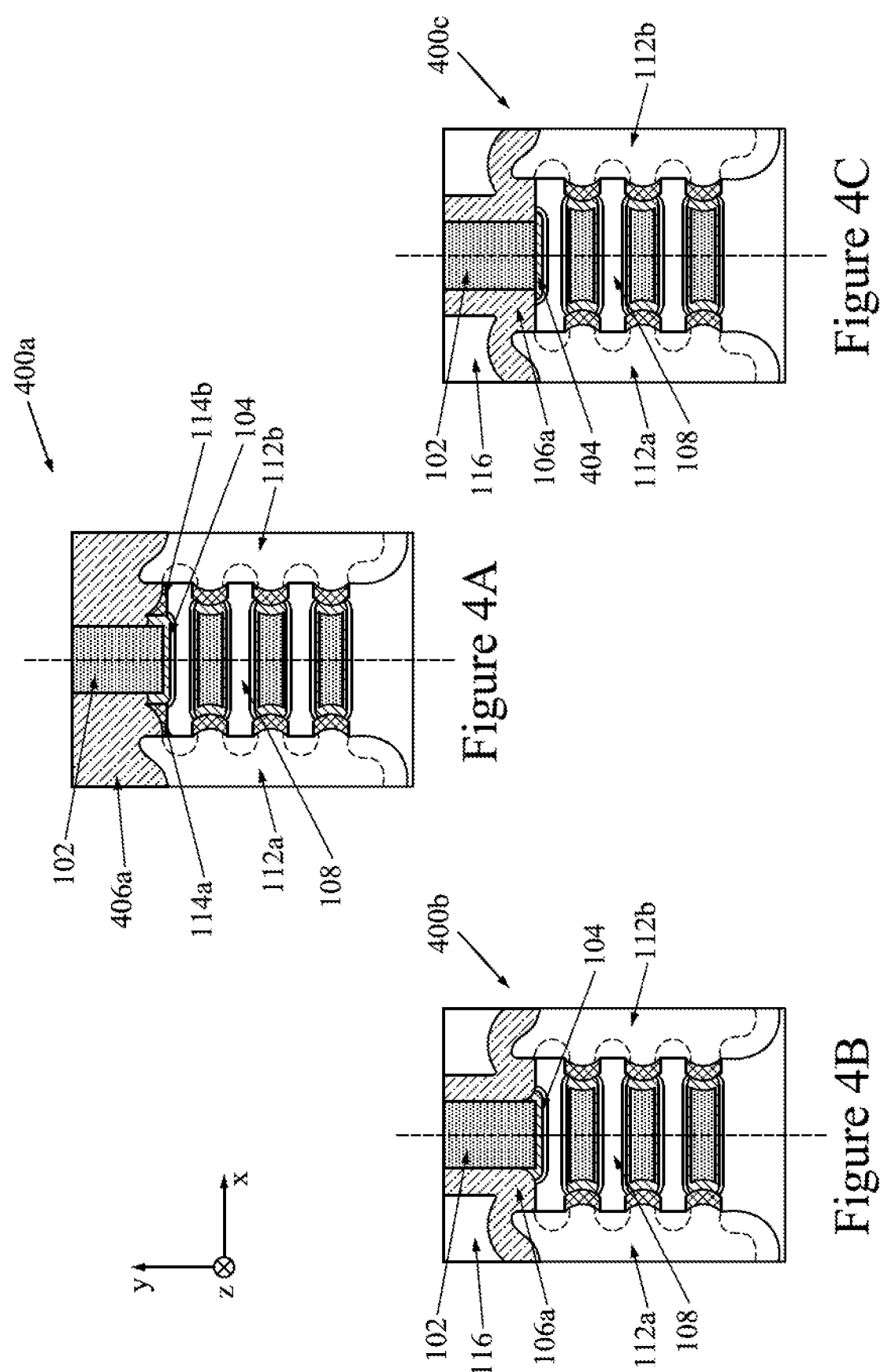
FIG. 4A is a cross-sectional view illustrating a semiconductor device in which a dielectric layer is removed from the structure, in accordance with some embodiments.
FIG. 4B is a cross-sectional view illustrating a semiconductor device in which spacers are removed from the structure, in accordance with some embodiments.
FIG. 4C is a cross-sectional view illustrating a semiconductor device in which portions of high-k material are removed from the structure, in accordance with some embodiments.

FIGS. 4A-4C are different embodiments of the device 100 described in FIGS. 1A-1B. The manufacturing process may be the same as the process described above for the device 100. In this fashion, some stages of manufacturing may be added or omitted to create a new embodiment. A dotted line in FIGS. 4A-4C along the y axis shows a symmetry axis, while the elements and materials that are described in one side of the symmetry axis can be the same in another side of the symmetry axis along the x axis.

FIG. 4A is a device 400*a* with a same gate electrode 102, HK dielectric 104, spacers 114*a* and 114*b*, source/drain regions 112*a* and 112*b*, and nanostructures 108 as described in FIG. 1B. In this embodiment, the step of depositing dielectric layer 316*a* is omitted. Instead, a thick layer of the second liner 406*a* is formed to fill the spaces around the gate electrode 102. The process stages of manufacturing the device 400*a* is less than the process stages of manufacturing the device 100. Thus, it can reduce the cost and time of the process. In some examples, material and manufacturing process of the second liner 406*a* may be the same as the second liner 106*a* described in FIG. 3D. For instance, the deposition process of the second liner 406*a* may include thermal growth, CVD, and PVD. The deposition process may include depositing the second liner 406*a* as a blanket layer. In this fashion, the blanket layer includes silicon nitride. The second liner 406*a* can be deposited on sidewalls of the gate electrode 102, over source/drain regions 112*a* and 112*b*, and over ILD-0 (not shown) along the y axis.

FIG. 4B is a device 400*b* with a same gate electrode 102, second liner 106*a*, dielectric layer 116 (ILD-1), HK dielectric 104, source/drain regions 112*a* and 112*b*, and three of the nanostructures 108 as described in FIG. 1B. In this fashion, the spacers 114a and 114b are removed and the second liner 106a refills the removed portions of the spacers 114a and 114b in FIG. 1B. For instance, the spacers 114a and 114b may be removed during the etching back process described in FIG. 3C. The etching process may include a dry etch, a wet etch, or a combination of dry etch and wet etch. The dry etching process may implement fluorine-containing gas (e.g., $CF_4$, $SF_6$, $CH_2F_2$, $CHF_3$, and/or $C_4F_8$), chlorine-containing gas (e.g., $Cl_2$, $CHCl_3$, $CCl_4$, and/or $BCl_3$), bromine-containing gas (e.g., HBr and/or $CHBr_3$), oxygen-containing gas, iodine-containing gas, other suitable gases and/or plasmas, or combinations thereof. In some examples, a bias voltage of the plasma etching may be controlled to selectively etch the gate spacers 314a and 314b in FIGS. 3B-3C. Although the spacers 314a and 314b in FIG. 3B (corresponding to the spacers 114a and 114b in FIG. 1B) maintain required spaces between the gate electrode 102 and source/drain regions 112a and 112b, the spacers 314a and 314b are totally removed in the embodiment of FIG. 4B and replaced with the second liner 106a after forming the gate contact 302 and HK dielectric 304. However, portions of sidewalls of the gate electrode 102 still are covered by the HK dielectric 104 along the x axis. Replacing the spacers 114a and 114b in FIG. 1B with the dielectric material 106 may increase isolation of the gate electrode 102 from the source/drain regions 112a and 112b as well as MD contacts (not shown).

Figure 5A:
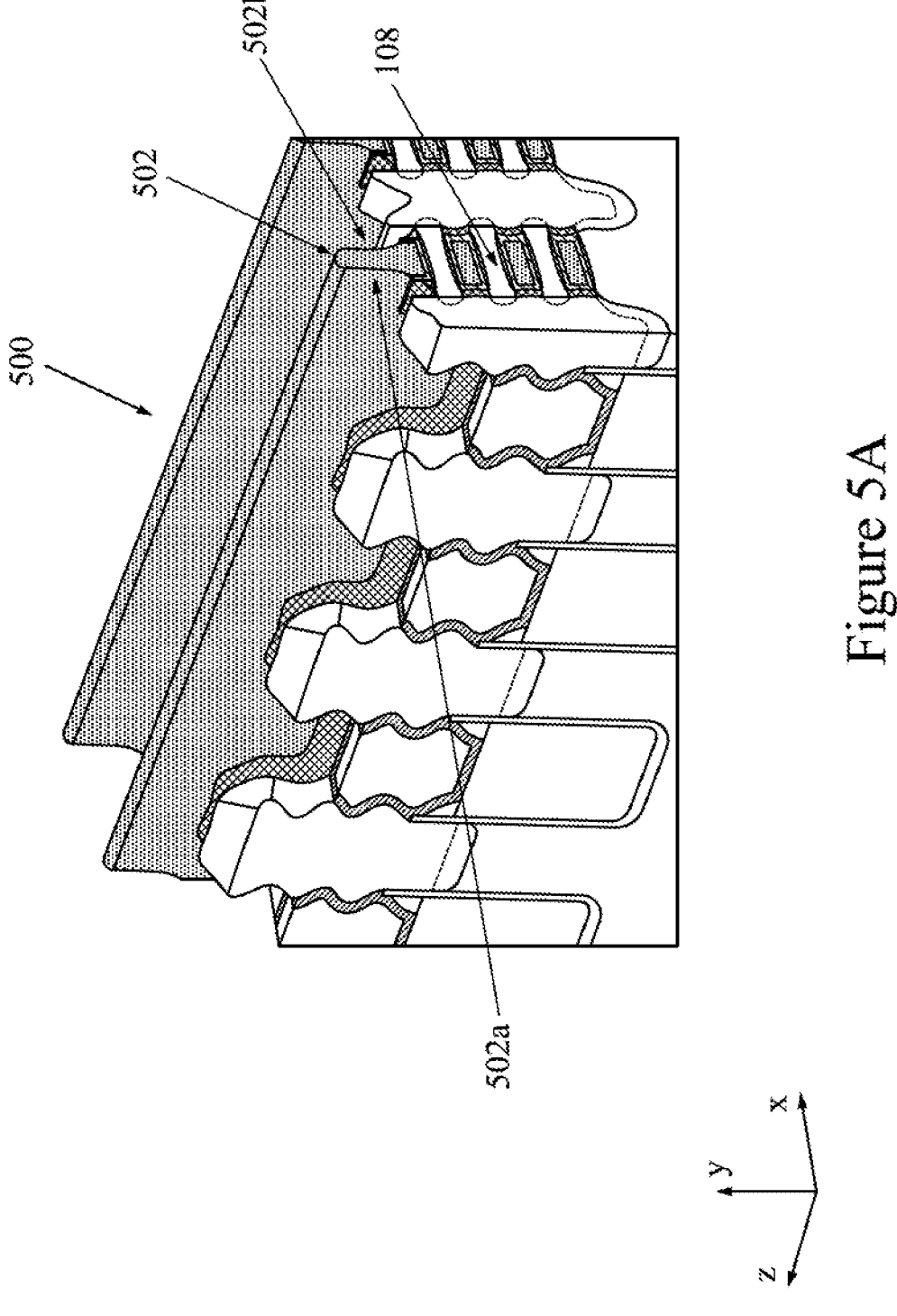
FIG. 5A is a three-dimensional view illustrating a semiconductor device, in accordance with some embodiments.

FIG. 4C is a device 400c with a same gate electrode 102, second liner 106a, dielectric layer 116, source/drain regions 112a and 112b, and nanostructure 108 as described in FIG. 1B. In this fashion, the spacers 114a and 114b as well as portions of the HK dielectric 104 over the sidewalls of the gate electrode 102 are removed and the second liner 106a refills the removed portions of the spacers 114a and 114b and HK dielectric 104 in FIG. 1B. Hence, the HK dielectric 404 only covers a portion between the nanostructure 108 and the gate electrode 102 along the y axis, while sidewalls of the gate electrode 102 are fully covered by the second liner 106a. In this fashion, the spacers 114a and 114b and the portions of HK dielectric 104 may be removed during the etching back process described in FIG. 3C. In some examples, electrical isolation capability of the dielectric material 106 is higher than the HK dielectric 104. Hence, replacing the HK dielectric 104 with the dielectric material 116 on sidewalls of the gate electrode 102 may increase isolation of the gate electrode 102 from the source/drain regions 112a and 112b as well as MD contacts (not shown). FIG. 5A is a same process of etching back as described in FIG. 3C to create a device 500, while during the etching process a portion of the gate electrode 502 is etched to form a rounded shape along the y axis. In some examples, the gate electrode 502 may be etched in a different step than the etching back process described in FIG. 3C. The etching process may include fluorine-containing gas (e.g., $CF_4$, $SF_6$, $CH_2F_2$, $CHF_3$, and/or $C_4F_8$), chlorine-containing gas (e.g., $Cl_2$, $CHCl_3$, $CCl_4$, and/or $BCl_3$), bromine-containing gas (e.g., HBr and/or $CHBr_3$), oxygen-containing gas, iodine-containing gas, other suitable gases and/or plasmas, or combinations thereof. The etching process may include a multiple step etching to etch the dielectric layers and metal layers in different steps. In some examples, a bias voltage of the plasma etching is controlled to selectively etch the portions of the gate electrode 502 while the metal gate stack between the nanostructure 108 remains undamaged.

Figures 5B, 5C:
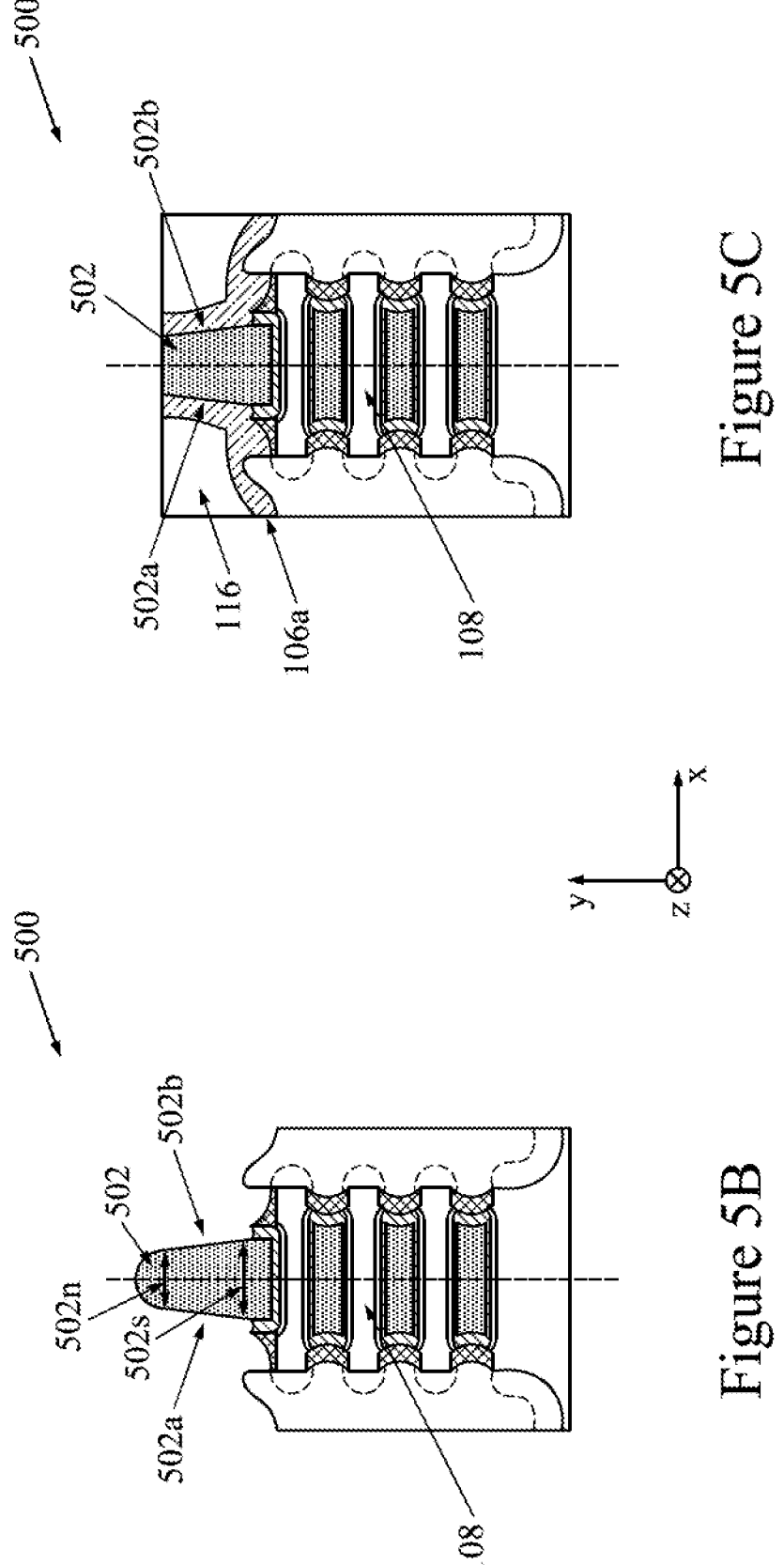
FIG. 5B is a cross-sectional view of the semiconductor device shown in FIG. 5A, in accordance with some embodiments.
FIG. 5C is a cross-sectional view illustrating the semiconductor device in FIG. 5A after further processing, in accordance with some embodiments.

In some embodiments, the etching of the gate electrode 502 may be anisotropic along the y axis and the x axis. In this fashion, a top portion of the gate electrode 502 along the y axis is rounded while sidewalls 502a and 502b are concave. FIG. 5B is a cross-sectional view of the device 500 in FIG. 5A to clearly show the concave shape of the sidewalls 502a and 502b. A dotted line in FIGS. 5B-5C along the y axis shows a symmetry axis, while the elements and materials that are described in one side of the symmetry axis can be the same in another side of the symmetry axis along the x axis. The concave portions 502a and 502b of the gate electrode 502 create a tip-like gate electrode along the y axis. In this fashion, the dimension of the gate electrode 502 along the x axis is decreased while moving from the bottom surface closer to the nanostructure 108 toward the rounded portion of the gate electrode 502 along the y axis. In some examples, a dimension 502s along the x axis of a bottom portion of the gate electrode 502 is greater than a dimension 502n along the x axis of a top portion of the gate electrode 502, while the bottom portion is closer to the nanostructure 108 compared with the top portion along the y axis. In some examples, etching of the top portion of the gate electrode 502 along the y axis may be in a separate step than etching the sidewalls 502a and 502b. In some examples, the rounded and concave shapes of the gate electrode 502 may be formed during the plasma etching process described in FIG. 3C, while a bias voltage of the etching is higher than the bias voltage in stage of FIG. 3C. Thus, the higher bias voltage of the plasma etching results in removing portions of the gate electrode 502.

FIG. 5C is the device 500 after forming the second liner 106a and the ILD-1 layer of the dielectric material 116 with a same process as described in FIG. 3D. In this fashion, the concave sidewalls 502a and 502b may enhance contacts between the metal gate (MG) with the second liner 106a by a smoother slope along the y axis compared with the gate electrode 102 in FIG. 3D. In addition, the reduced dimension of the top portion of the gate electrode 502 along the y axis may enhance electrical isolation between the MG with MD (not shown), where a distance between the MG and MD along the x axis is increased in top portions of the gate electrode 502 along the y axis and the increased distance is filled with dielectric materials.

Figure 6A:
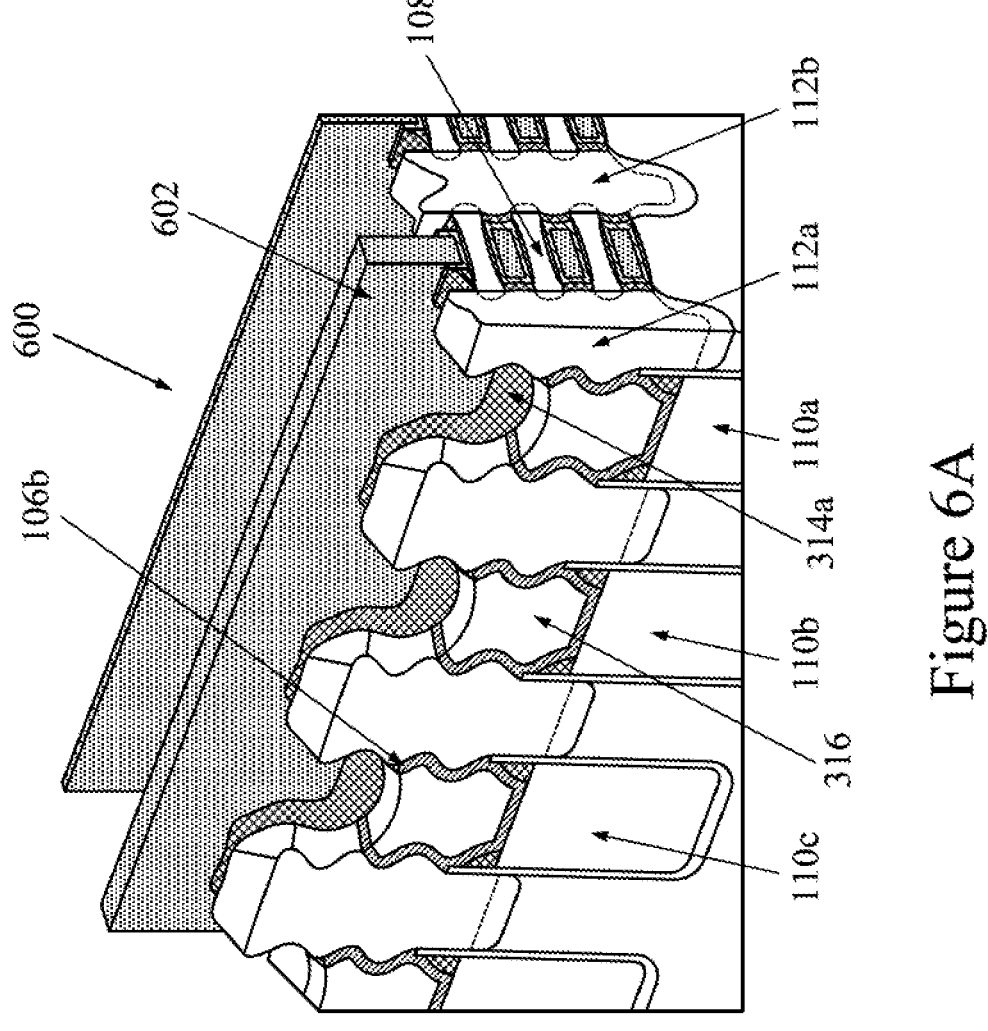
FIG. 6A is a three-dimensional view illustrating a semiconductor device, in accordance with some embodiments.

FIG. 6A shows a same process of etching back as described in FIG. 3C to create a device 600, while a portion of the spacer 314a and dielectric layer 316 (ILD-0) are recessed along the y axis during the etching process to concave trenches over the ILD-O area. In some examples, the recess of the spacer 314a and dielectric layer 316 of the trenches 110a-110c along the y axis may be etched in a different step than the etching back process described in FIG. 3C. The etching process may include fluorine-containing gas (e.g., $CF_4$, $SF_6$, $CH_2F_2$, $CHF_3$, and/or $C_4F_8$), chlorine-containing gas (e.g., $Cl_2$, $CHCl_3$, $CCl_4$, and/or $BCl_3$), bromine-containing gas (e.g., HBr and/or $CHBr_3$), oxygen-containing gas, iodine-containing gas, other suitable gases and/or plasmas, or combinations thereof. The etching process may include a multiple step etching to etch the dielectric layers and metal layers in different steps. In some examples, a bias voltage of the plasma etching is controlled to selectively etch excessive portions of the spacer 314a and dielectric layer 316 along the y axis while the source/drain regions 112a and 112b, metal electrode 602, and metal gate stack between the nanostructure 108 remain undamaged.

Figure 6B:
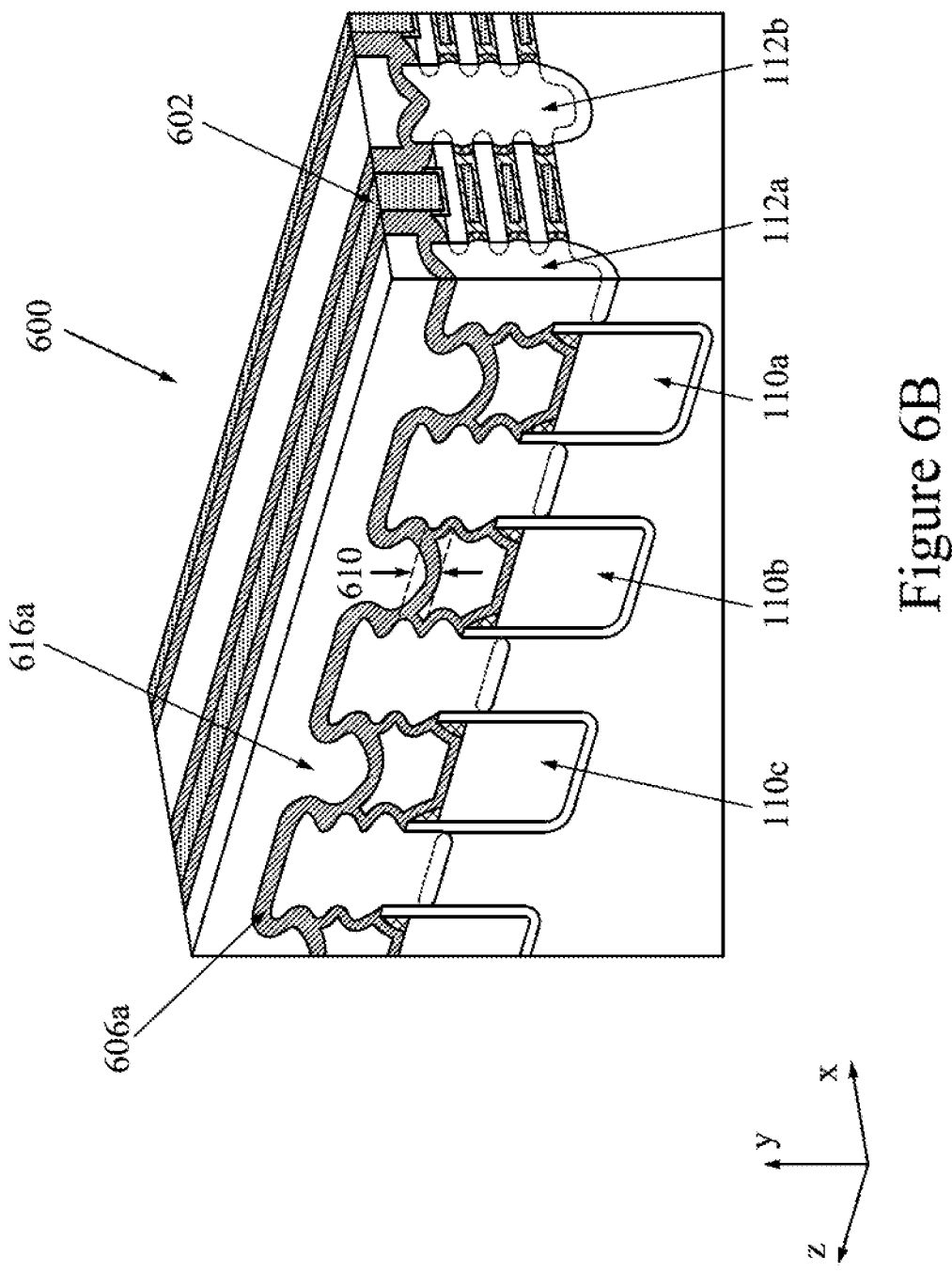
FIG. 6B is a cross-sectional view of the semiconductor device in FIG. 6A after further processing, in accordance with some embodiments.

FIG. 6B shows a stage of manufacturing a second liner 606a and dielectric layer 616a (ILD-1) corresponding to the stage of manufacturing the second liner 106a and dielectric layer 316a as described in FIG. 3D. In this embodiment, the second liner 606a may be deposited conformally over sidewalls of the gate electrode 602, source/drain regions 112a and 112b, and over dielectric layer 316 of the trenches 110a-110c. For instance, the deposition process may include thermal growth, CVD, PVD, and ALD. The deposition process may include depositing the second liner 606a as a blanket layer. In this fashion, the blanket layer includes silicon nitride and is deposited by a conformal deposition technique, such as an ALD process. The concave shape of the dielectric layer 316 in trenches 110a-110c results in a concave shape of the second liner 606a in trench areas. In some examples, the concave shape may have a depth 610 along the y axis of each of the trenches 110a-110c. In this fashion, the depth 610 may be about 1 nm to about 5 nm along the y axis. The depth 610 may provide smooth contact of the gate electrode 602 at the edge of each of the trenches 110a-110c. Afterward, the dielectric layer 616a is formed on the second liner 606a in the same way as the stage of forming dielectric layer 316a described in FIG. 3D. In this fashion, dielectric layer 616a may be formed by the dielectric material 116 as described in FIG. 1B. In some examples, dielectric layer 616a is formed over the second liner 606a by a deposition process, such as CVD, PVD, ALD, HDPCVD, MOCVD, RPCVD, PECVD, LPCVD, ALCVD, APCVD, plating, other suitable methods, or combinations thereof. In some implementations, dielectric layer 616a is formed by a flowable CVD (FCVD) process that includes, for example, depositing a flowable material (such as a liquid compound) over the second liner 606a and converting the flowable material to a solid material by a suitable technique, such as thermal annealing and/or ultraviolet radiation treating. In some embodiments, after deposition of the dielectric layer 616a, the deposited dielectric material is thinned and planarized, for example, by a chemical mechanical polishing (CMP) process.

Figure 7A:
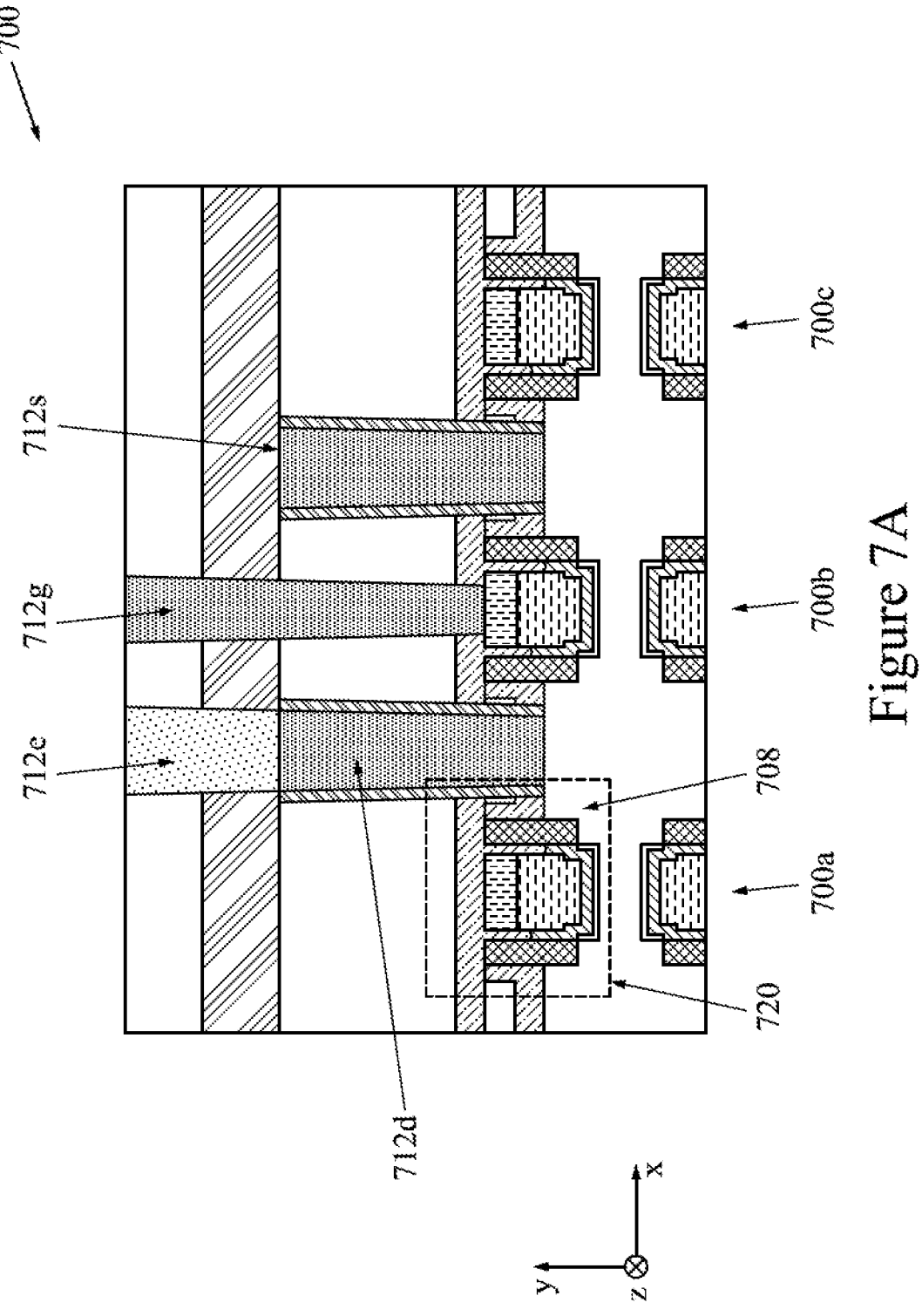
FIG. 7A is a cross-sectional view illustrating a semiconductor device, in accordance with some embodiments.

FIG. 7A is a cross-sectional view of an embodiment including a plurality of transistors 700a-700c. In some embodiments, the plurality of transistors may include more than three transistors 700a-700c shown in FIG. 7A. Each of the plurality of transistors 700a-700c may be formed in a same process as that described in FIGS. 1A-6B. In some embodiments, the plurality of transistors 700a-700c may form a circuit 700. In some examples, the circuit 700 may be used in a static random access memory (SRAM). In this embodiment, each of the transistors 700a-700c may include three terminals to be coupled to an external circuit. For instance, the device 700b includes three contacts 712e, 712g, and 712s to be coupled to an external circuit. In this embodiment, the contact 712e may be a first source/drain contact coupled to a source/drain region of the transistor 700b by a contact 712d, the contact 712g may be a gate contact coupled to the gate electrode 702 of the transistor 700b, and the contact 712s may be a second source/drain contact coupled to another source/drain region of the transistor 700b. In various embodiments, the drain region and the source region of the transistors 700a-700c may have the same electrical characteristics (e.g., doping type and concentrations), as indicated by source/drain (S/D) hereinafter. In some embodiments, the S/D region may be a common S/D between two adjacent transistors. For example, S/D region that is coupled to the contact 712d is a common S/D that is shared by each of the transistors 700a and 700b, and S/D region that is coupled to the contact 712s is a common S/D that is shared by each of the transistors 700b and 700c. In some examples, each of the plurality of transistors 700a-700c includes one or more nanostructure 708 stacked along the y axis corresponding to the nanostructure 108 described in the embodiments of FIGS. 1A-1B. In addition, each of the plurality of transistors 700a-700c includes a region 720 as indicated in FIG. 7A. In some examples, the region 720 may include a fin-like structure along the z axis (not shown) and may be created with a same process and material described in the embodiments of FIGS. 1A-6B.

Figure 7B:
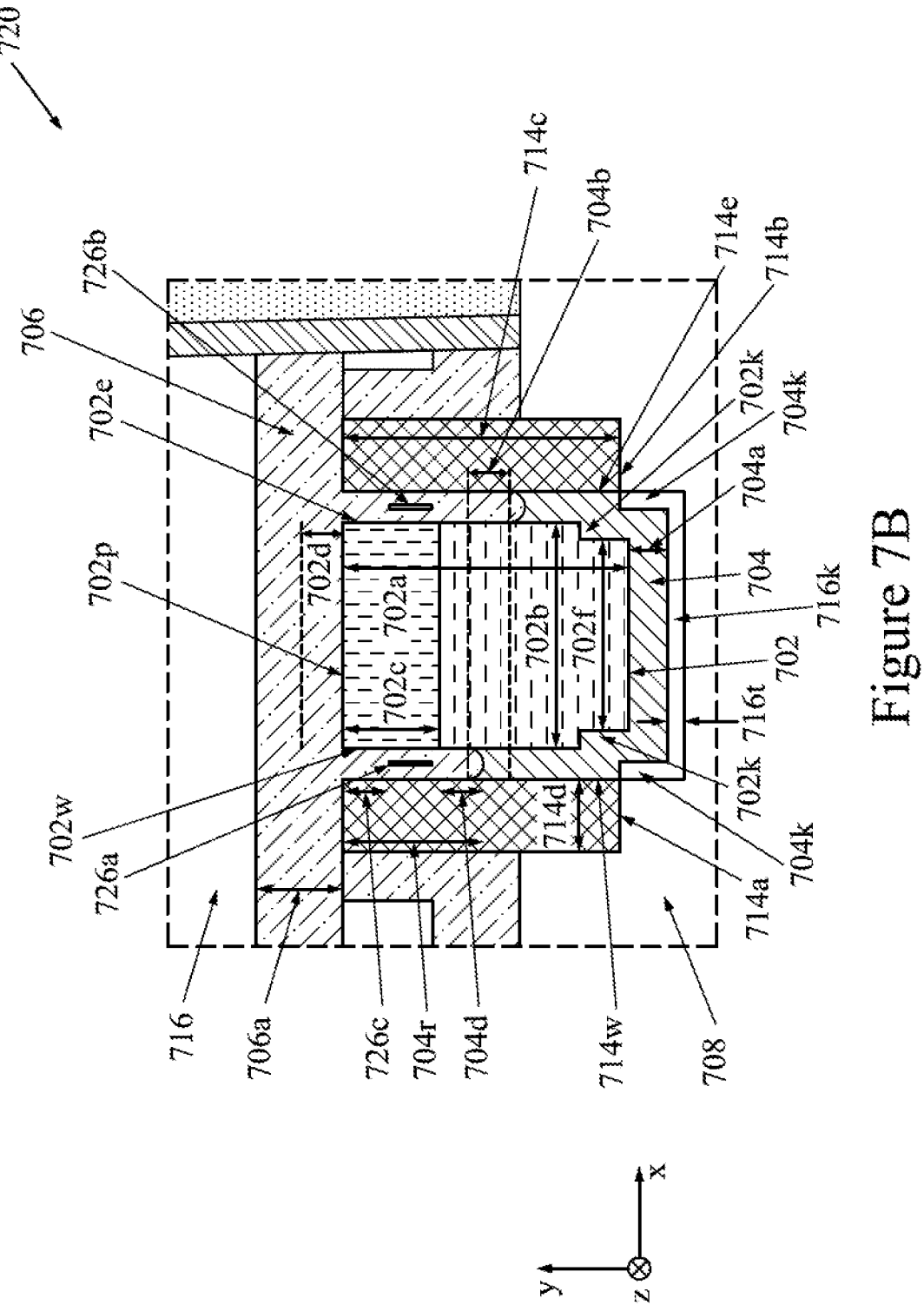
FIG. 7B is a cross-sectional view illustrating further details of a region 720 of the semiconductor device shown in FIG. 7A, in accordance with some embodiments.

FIG. 7B shows more detail of the region 720 in FIG. 7A. The region 720 includes a gate electrode 702 (including stacks of metal between the nanostructures 708), a gate dielectric 704, a refill dielectric 706, the nanostructure 708, spacers 714a and 714b, and an inter-layer dielectric (ILD) 716k. In some embodiments, the gate electrode 702 corresponds to the gate electrode 102 in FIG. 1B, the gate dielectric 704 corresponds to the HK dielectric 104 in FIG. 1B, the refill dielectric 706 corresponds to the dielectric material 106 in FIG. 1B, the spacers 714a and 714b correspond to the spacers 114a and 114b in FIG. 1B, and interfacial layer 716k corresponds to the interfacial layer 116k in FIG. 1B. In some examples, one or more elements of the region 720 may include different materials and/or different structures than the elements of the embodiment described in FIG. 1B.

In some embodiments, the gate electrode 702 has a dimension 702a along the y axis and a dimension 702b along the x axis. In some examples, the dimension 702a is greater than or equal to the dimension 702b. The gate electrode 702 may include one or more layers of conductive material. In some embodiments, the conductive material may include one or more metal layers of aluminum (Al), copper (Cu), tungsten (W), titanium (Ti), tantalum (Ta), or a combination thereof. In some implementations, the gate electrode 702 includes a capping layer 702p to protect the metal layer of the gate electrode 702. In addition, the gate electrode 702 may include multiple layers, such as a work function layer, a glue/barrier layer, and a metal fill (or bulk) layer. The capping layer 702p may include tungsten (W), cobalt (Co), molybdenum (Mo), ruthenium (Ru), nickel (Ni), copper (Cu), or other metals, and may be formed by CVD, PVD, ALD, plating, or other suitable processes. The capping layer has a dimension 702c along the y axis. In some embodiments, the dimension 702a is greater than the dimension 702c. For instance, the dimension 702a may be about 10 nm to about 30 nm, while the dimension 702c is about 1 nm to about 8 nm. The dimension 702c higher than 8 nm may cause an insufficient reduction in gate contact resistance. In some examples, an edge of the capping layer 702p can be aligned with an edge of the spacer 714a and/or 714b along the y axis. Alternatively, the edge of the capping layer 702p may extend past the edge of the spacers 714a and/or 714b along the y axis. In this fashion, the capping layer 702p may extend past the edge of the spacers 714a and/or 714b by a dimension 702d along the y axis. In some examples, the spacers 714a and/or 714b may extend past the capping layer 702p by the dimension 702d. The dimension 702d may be up to 2 nm.

In various embodiments, the gate dielectric 704 is an HK dielectric material as described in FIG. 1B. For instance, the HK dielectric materials may include ZrAlO, TiO, TaO, ZrO, HfO, LaO, AlO, YO, ZnO, HZO, or a combination thereof. In some examples, the gate dielectric 704 may cover an edge of the gate electrode 702 along the y axis, a portion of a first sidewall 702w of the gate electrode 702, and a portion of the second sidewall 702e. In some examples, the gate dielectric 704 covers the portions of the gate electrode 702 conformally with a constant thickness 704a. The thickness 704a may be about 0.5 nm to about 5 nm. Thickness 704a lower than about 0.5 nm may lead to electrical shorting with the nanostructures 708. Thickness 704a above about 5 nm may cause excessive electrical isolation between the gate electrode 702 and the nanostructure 708. Alternatively, the thickness 704*a* may be anisotropic along the y axis and the x axis. In some embodiments, the HK dielectric material of the gate dielectric 704 may cover a full portion of the first sidewall 702*w* and/or the second sidewall 702*e*. In other embodiments, the HK dielectric in material of the gate dielectric 704 may be recessed from portions of the first sidewall 702*w* and/or the second sidewall 702*e*. In some examples, a recessed portion of the gate dielectric 704 from the first sidewall 702*w* may have a different depth than a recessed portion of the gate dielectric 704 from the second sidewall 702*e*. For instance, the difference between the depth of the recessed portions from the first sidewall 702*w* and the second sidewall 702*e* is a dimension 704*b* that may be about 1 nm to about 5 nm. In some examples, the dimension 704*b* may not be present. In some embodiments, the HK dielectric material of the gate dielectric 704 may cover a portion of the capping layer 702*p* of the first sidewall 702*w* and/or the second sidewall 702*e*. In some examples, the recessed portion of the gate dielectric 704 from the first sidewall 702*w* and/or the second sidewall 702*e* may extend past the capping layer along the y axis, and consequently the dielectric layer 704 may not cover the portion of the capping layer 702*p* of the first sidewall 702*w* and/or the second sidewall 702*e*. In this fashion, the recessed portions of the first sidewall 702*w* and/or the second sidewall 702*e* may be refilled with the refill dielectric 706. The recessed portions may have a dimension 704*r* along the y axis. In some examples, the dimension 704*r* may be about 2 nm to about 10 nm. In some examples, the recessed portion of the gate dielectric 704 from the first sidewall 702*w* and/or the second sidewall 702*e* may form a concave shape of the HK material along the y axis. The concave shape of the gate dielectric 704 may have a dimension 704*d* along the y axis. The dimension 704*d* may be about 1 nm to about 3 nm.

In various embodiments, the refill dielectric 706 is formed on an edge of the capping layer 702*p* along the y axis as well as the recessed portions of sidewalls 702*w* and 702*e* along the y axis. In some examples, a dielectric material of the refill dielectric 706 corresponds to dielectric material 106 described in FIG. 1B. For instance, the dielectric material of the refill dielectric 706 may include SiCN, SiO, SiCON, SiN, SiC. In some examples, the refill dielectric 706 may cover an edge of each of the spacers 714*a* and 714*b* along the y axis, and a portion of the sidewalls of the spacers 714*a* and 714*b* along the x axis. In this fashion, the refill dielectric 706 over the spacers 714*a* and 714*b* has a dimension 706*a* along the y axis. The dimension 706*a* may be about 0.5 nm to about 6 nm. The dimension 706*a* lower than about 0.5 nm may lead to the electrical leakage from the capping layer 702*p*. The dimension 706*a* above about 6 nm may cause excessive material consumption over the capping layer 702*p*. In some embodiments, a dielectric constant of the dielectric material of the refill dielectric 706 may be less than a dielectric constant of the HK dielectric material of gate dielectric 704. In this embodiment, an electric isolation capability of the dielectric material of the refill dielectric 706 may be greater than an electrical isolation capability of the HK dielectric material of the gate dielectric 704. Hence, recessing a portion of the HK dielectric material from the sidewalls 702*w* and 702*e* of the gate electrode 702 and refilling the recessed portions with the refill dielectric 706 may enhance an electrical isolation between the gate electrode 702 and contacts of the device adjacent to the gate electrode 702 along the x axis. Increasing the electrical isolation provides an opportunity to reduce distances between the contacts of the plurality of transistors 700*a*-700*c* of the circuit 700 without suffering from electrical leakage between the contacts. Consequently, a total size of the circuit 700 can be reduced during a scaling process.

In some embodiments, a first void 726*a* is formed in a portion of the refill dielectric 706 between the first spacer 714*a* and the first sidewall 702*w* of the gate electrode 702, and a second void 726*b* is formed in a portion of the refill dielectric 706 between the second spacer 714*b* and the second sidewall 702*e* of the gate electrode 702. In this embodiment, the first void 726*a* and the second void 726*b* affect an effective dielectric constant of the refill dielectric 706 in portions of the sidewalls 702*w* and 702*e*. For instance, the first void 726*a* and the second void 726*b* may be formed from air holes. In this embodiment, as a dielectric constant of air is less than the dielectric constant of the refill dielectric 706, the effective dielectric constant of the refill portion of the sidewalls 702*w* and 702*e* is less than the dielectric constant of the refill dielectric 706. In some embodiments, the voids 726*a* and/or 726*b* may not be present. In some examples, a position of the voids 726*a* and/or 726*b* have a distance 726*c* from an edge of the spacers 714*a* and/or 714*b* along the y axis. The distance 726*c* may be about 0.1 nm to about 10 nm. In addition, the voids 726*a* and/or 726*b* may have a circular or elliptical shape. In this embodiment, a vertical dimension of the voids 726*a* and/or 726*b* may be about 0.5 nm to about 6 nm along the y axis, while a horizontal dimension of the voids 726*a* and/or 726*b* may be about 0.5 nm to about 2 nm along the x axis. Reducing the effective dielectric constant between the sidewalls 702*w* and 702*e* by the spacers 714*a* and 714*b*, respectively, may increase the electrical isolation between the gate electrode 702 and adjacent contacts along the x axis.

In some embodiment, the spacers 714*a* and 714*b* may have the same or different dimensions. In some examples, the spacers 714*a* and 714*b* may be formed from a material described for the spacers 114*a* and 114*b* in FIG. 1B. For instance, the material of the spacers 714*a* and 714*b* may include SiCN, SiO, SiCON, SiN, SiC, or a combination thereof. In some examples, a dimension 714*c* of the spacers 714*a* and/or 714*b* is the same or less than the dimension 702*a* of the gate electrode 702 along the y axis. A dimension 714*d* of the spacers 714*a* and/or 714*b* may be about 1 nm to about 10 nm. In some examples, the dimension 714*d* is less than the dimension 714*c*. Each of the spacers 714*a* and 714*b* has an edge coupled to the nanostructure 708 along the y axis, a first sidewall coupled to the gate dielectric 704 and the refill dielectric 706 along the x axis, and a second sidewall (opposite to the first sidewall) that is coupled to the nanostructure 710 and the refill dielectric along the x axis. The spacers 714*a* and 714*b* provide a desired space between the gate electrode 702 and adjacent contacts such as S/D regions along the x axis.

In some embodiments, a dielectric 716 covers the top of the refill dielectric 706 of the region 720 corresponding to the dielectric material 116 in FIG. 1B. The dielectric 716 may be formed with a same material 116 as described in FIG. 1B. In some embodiments, the interfacial layer 716*k* is formed between the gate dielectric 704 and the nanostructure 708. The interfacial layer 716*k* may have a same material as the dielectric 716. Alternatively, the interfacial layer 716*k* may be an oxide of the material of the nanostructures 708. In some examples, the interfacial layer 716*k* surrounds a bottom portion of the gate dielectric 704 from the bottom edges of the spacers 714*a* to the bottom edges of the spacers 714*b* along the y axis. In this fashion, a thickness 716*t* of the interfacial layer 716*k* may be about 1 nm to about 5 nm. Thickness 716*t* lower than about 1 nm may lead to electrical shorting with the nanostructures 708. Thickness 716*t* above about 5 nm may cause excessive electrical isolation between the gate electrode 702 and the nanostructure 708. In some examples, the gate dielectric 704 may define recessed portions 704*k*, which may be recessed regions in which the gate dielectric 704 is recessed. The recessed portions 704*k* are recessed in the gate dielectric 704 to provide a space in which the interfacial layer 716*k* may be formed in alignment with sidewalls 714*w* and 714*e* of the spacers 714*a* and 714*b* along the x axis, respectively. Thus, boundaries of the dielectric layer 716*k* along the x axis are aligned with the boundaries of the gate dielectric 704 where are in contact with the sidewalls 714*w* and 714*e* along the x axis. In addition, portions 702*k* in the bottom corners of the gate electrode 702 along the y axis are recessed to compensate for the recessed portions 704*k* in the gate dielectric 704. The portions 702*k* provide enough spaces for the gate dielectric 704 to conformally surround bottom portions of the gate electrode 702 along the y axis. Thus, a bottom portion of the gate electrode 702 has a dimension 702*f* along the x axis, where the dimension 702*f* is less than the dimension 702*b*.

FIGS. 8A-8G illustrate a process of creating the plurality of transistors 700*a*-700*c* to form the circuit 700 in FIG. 7A. In this embodiment, the process may correspond to the process that is described for embodiments of FIGS. 2A-6B. Prior to the stage of FIG. 8A, there are some primary stages of manufacturing nanostructure, gate dielectric, spacers, and S/D regions that are not shown for simplicity. The primary stages may correspond to the process described above in FIGS. 2A-6B. Material of portions with the same numeral references are the same as the material and structures that are described in FIGS. 7A-7B.

Figure 8A:
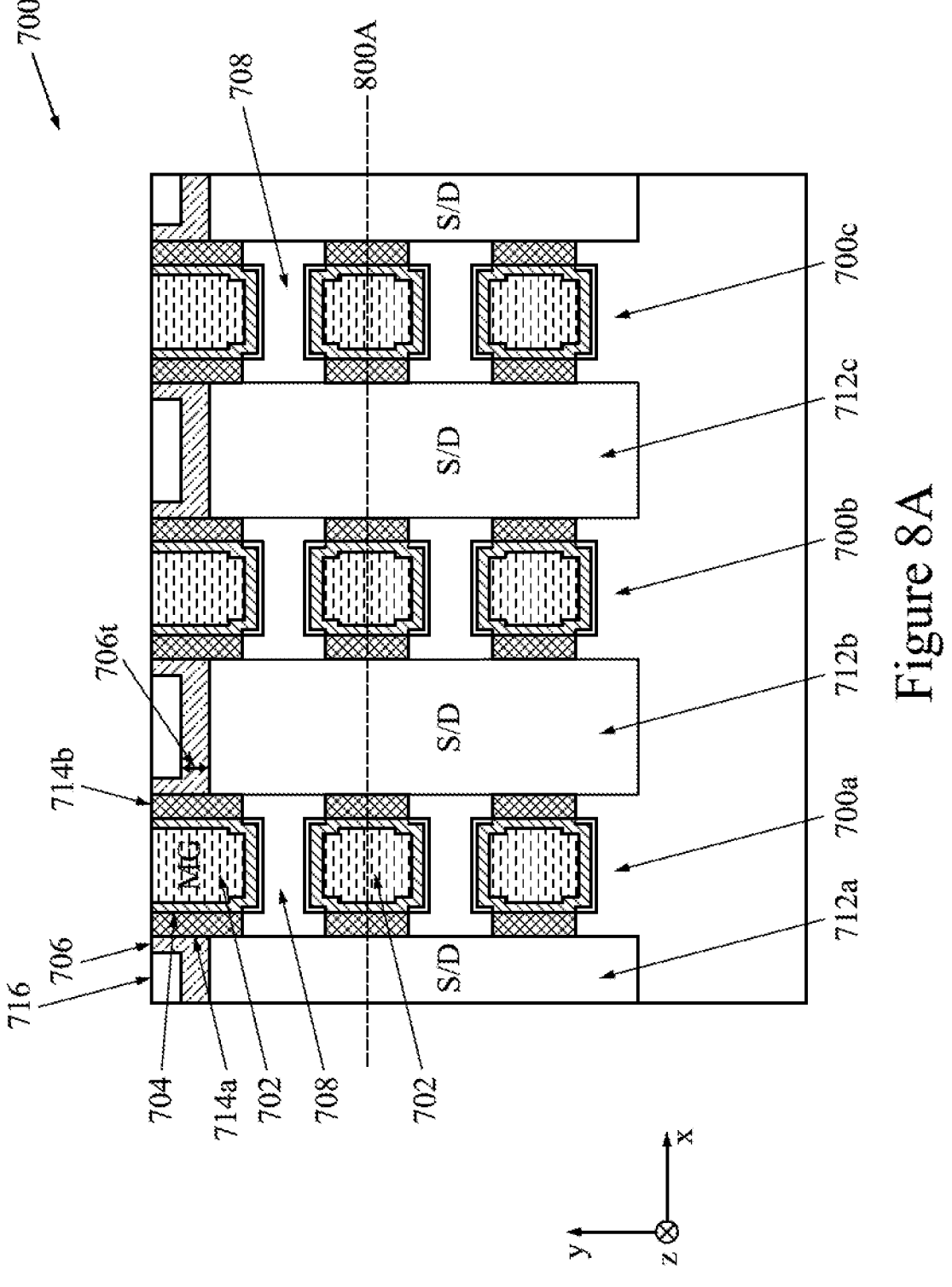
FIGS. 8A-8G are cross-sectional views illustrating the semiconductor device in FIG. 7A at various stages of manufacturing, in accordance with some embodiments.

FIG. 8A is a stage of manufacturing the gate electrode 702 over the gate dielectric 704 along the y axis and between the spacers 714*a* and 714*b* along the x axis. In this fashion, the circuit 700 includes three transistors 700*a*-700*c* as described in FIG. 7A. In various embodiments, the circuit 700 may include a lesser or a greater number of transistors with a same or different structure as described here. Dashed line 800A depicts a boundary of the circuit 700 shown in FIG. 7A. A portion of the circuit 700 below the dashed line 800A along the y axis is not shown in FIG. 7A and in FIGS. 8B-8G for simplicity. Each transistor is coupled to an adjacent transistor along the x axis through a source/drain (S/D) region. In this fashion, S/D regions 712*a*-712*c* may be formed in the same way as the source/drain regions 112*a*, 112*b* described in FIG. 1A. In addition, each transistor may include one or more nanostructures stacked along the y axis that may be the same as the nanostructure 108 described in FIGS. 1A-6B. In various embodiments, the number of stacked nanostructures may be different based on the desired channel characteristics of the transistor. In this example, two nanostructures 708 are formed for each transistor. Each metal layer is stacked between the nanostructures 708 that may have a same structure as the gate electrode 702, where it is coupled to the nanostructure 708 by an HK dielectric layer and interfacial layer (e.g., layers 716*k* and 704 by the recessed portions 704*k* and 702*k*) as described in region 720 of FIG. 7B. In this stage, a dielectric layer 706 is conformally formed on the S/D regions 712*a*-712*c* along the y axis and the spacers (e.g., 714*a* and 714*b*) along the x axis that corresponds to the second liner 106*a* described in FIG. 3D. In some examples, the dielectric layer 706 may form a contact etch stop layer (CESL). A thickness 706*t* of the CESL dielectric layer 706 may be about 1 nm to about 5 nm.

The dielectric layer 716 is formed over the dielectric layer 706 along the y axis. The stage of FIG. 8A may correspond to the stage of FIG. 3D, where the gate electrode 702 is formed by a metal gate (MG), dielectric layer 716 is deposited as an ILD layer, and the devices are thinned and planarized by a chemical mechanical polishing (CMP) process.

Figure 8B:
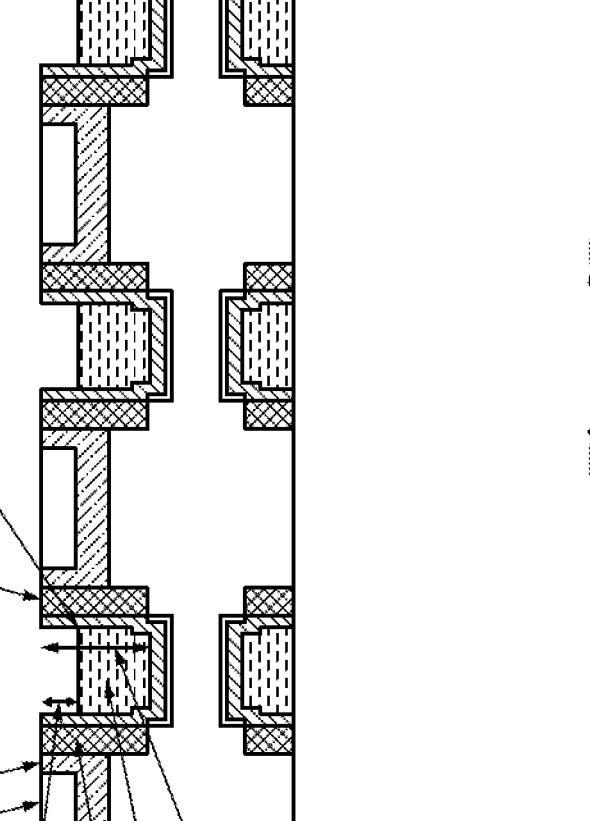

FIG. 8B is an etching process to remove a portion of MG from the gate electrode 702 along the y axis. In some examples, the etching process may include a dry etch, a wet etch, or a combination of dry etch and wet etch. For instance, the etching process may be a plasma etching to selectively etch the portion of the MG from the gate electrode 702 while HK material of the gate dielectric 704, spacers 714*a*, 714*b*, and dielectric material of 706, 716 remain undamaged. In some examples, the portion of etching may be patterned by a photolithography process, while a photoresist layer protects HK material of the gate dielectric 704, spacers 714*a*, 714*b*, and dielectric material of 706, 716 from etching. A depth of etching may be the same as the dimension 702*c* described in FIG. 7B. As described above, the dimension 702*c* may be about 1 nm to about 8 nm, while the dimension 702*a* of the gate electrode 702 may be about 10 nm to about 30 nm.

Figure 8C:
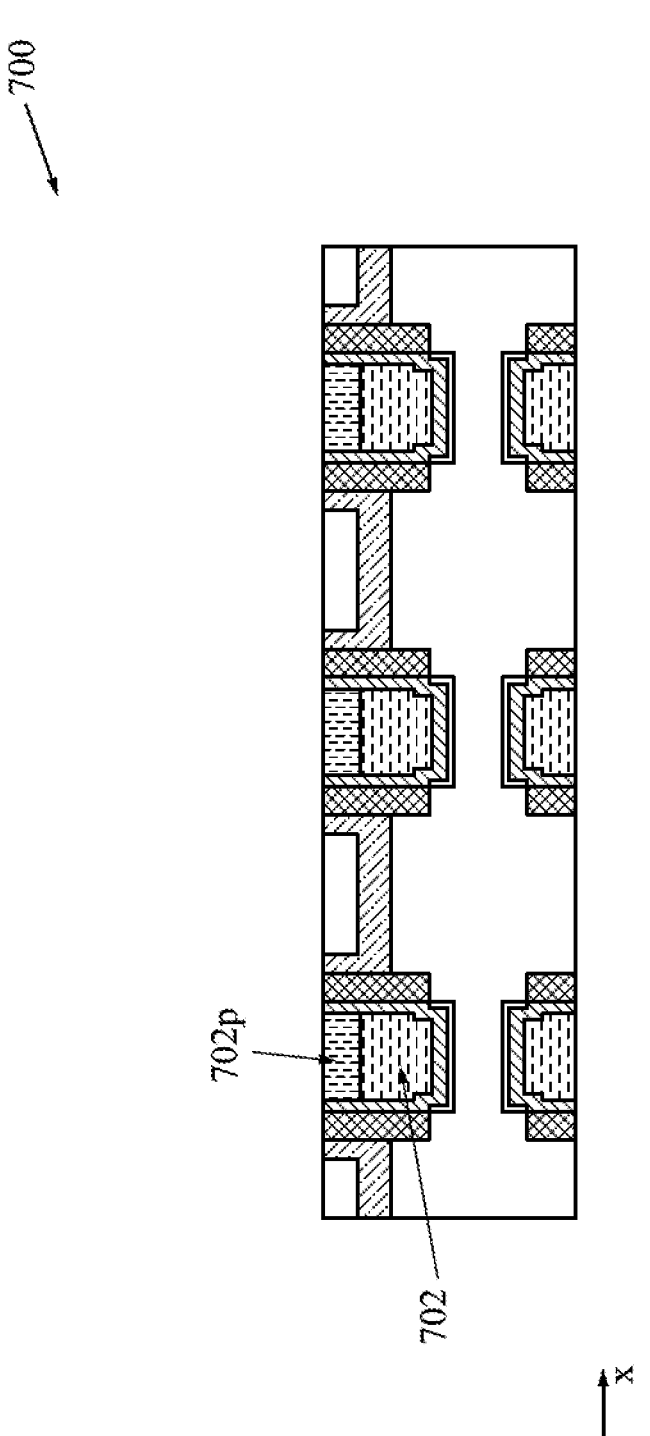

In the stage of FIG. 8C, the capping layer 702*p* is deposited on the portion of the gate electrode 702 that is etched in the stage of FIG. 8B. In this fashion, as described above for the embodiments of FIGS. 1A-6B, the capping layer 702*p* may include tungsten (W), cobalt (Co), molybdenum (Mo), ruthenium (Ru), nickel (Ni), copper (Cu), or other metals, and may be formed by CVD, PVD, ALD, plating, or other suitable processes. In some examples, the capping layer 702*p* may be selectively grown over the etched portion of the gate electrode 702. After forming the capping layer 702*p*, a surface of the device along the y axis may be thinned and planarized by a chemical mechanical polishing (CMP) process.

Figure 8D:
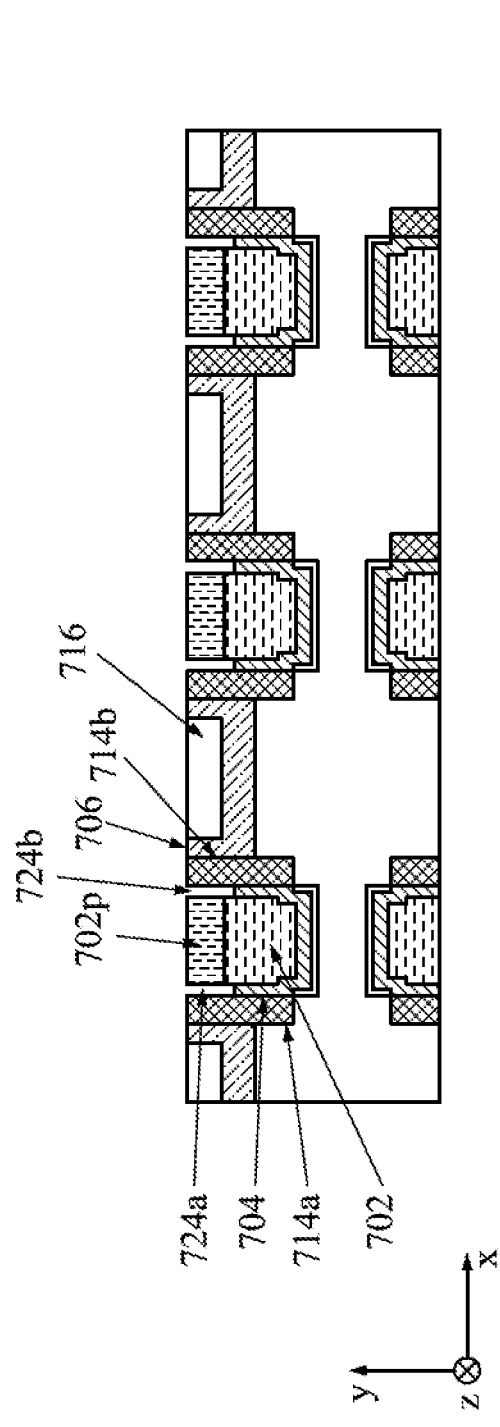

FIG. 8D is a process of etching back portions of the HK material of the gate dielectric 704 along the y axis. In this process, the gate dielectric 704 is recessed from portions 724*a* and 724*b* between the sidewalls of the gate electrode 702 and the spacers 714*a* and 714*b*. In some examples, a depth of the portions 724*a* and 724*b* along the y axis may be the same as the dimension 704*r* described in FIG. 7B. In some examples, the etching process may be the same as the process described in FIG. 3C. For instance, the etching may include plasma etching. In this fashion, a bias voltage of the plasma etching is controlled to selectively etch the portions 724*a* and 724*b* while the gate electrode 702, spacers 714*a*, 714*b*, and dielectric material of 706, 716 remain undamaged. In this fashion, a bias voltage greater than 10 V may damage the gate electrode 702. Thus, the bias voltage of the plasma etching process is controlled to be less than 10 V. In some examples, the portion of etching may be patterned by a photolithography process, while a photoresist layer protects the capping layer 702*p*, spacers 714*a*, 714*b*, and dielectric material of 706, 716 from etching.

Figure 8E:
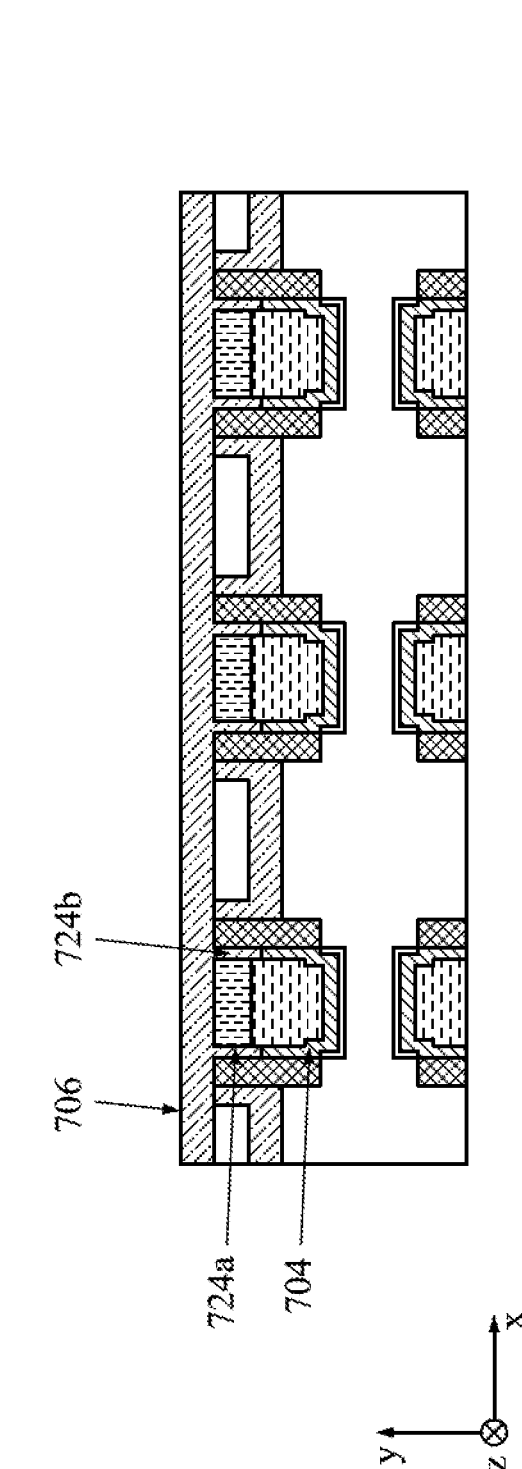

The stage of FIG. 8E is refilling the portions 724*a* and 724*b* with the dielectric 706. As described above, the dielectric constant of the dielectric 706 is less than the dielectric constant of the HK material of the gate dielectric 704. In addition, the electrical isolation of the dielectric 706 is greater than the electrical isolation of the HK material. Hence, recessing the gate dielectric 704 from the portions 724*a* and 724*b*, and refilling the portions 724*a* and 724*b* with the dielectric 706, enhance electrical isolation between the gate electrode 702 and adjacent contacts and devices along the x axis. In some examples, the dielectric 706 may be formed by a chemical vapor deposition (CVD) process, a sub-atmospheric CVD (SACVD) process, a flowable CVD (FCVD) process, an atomic layer deposition (ALD) process, a physical vapor deposition (PVD) process, or a combination thereof. In this fashion, a top portion of the circuit 700 may be covered with the dielectric 706 as a capping dielectric layer to protect devices along the x axis.

Figure 8F:
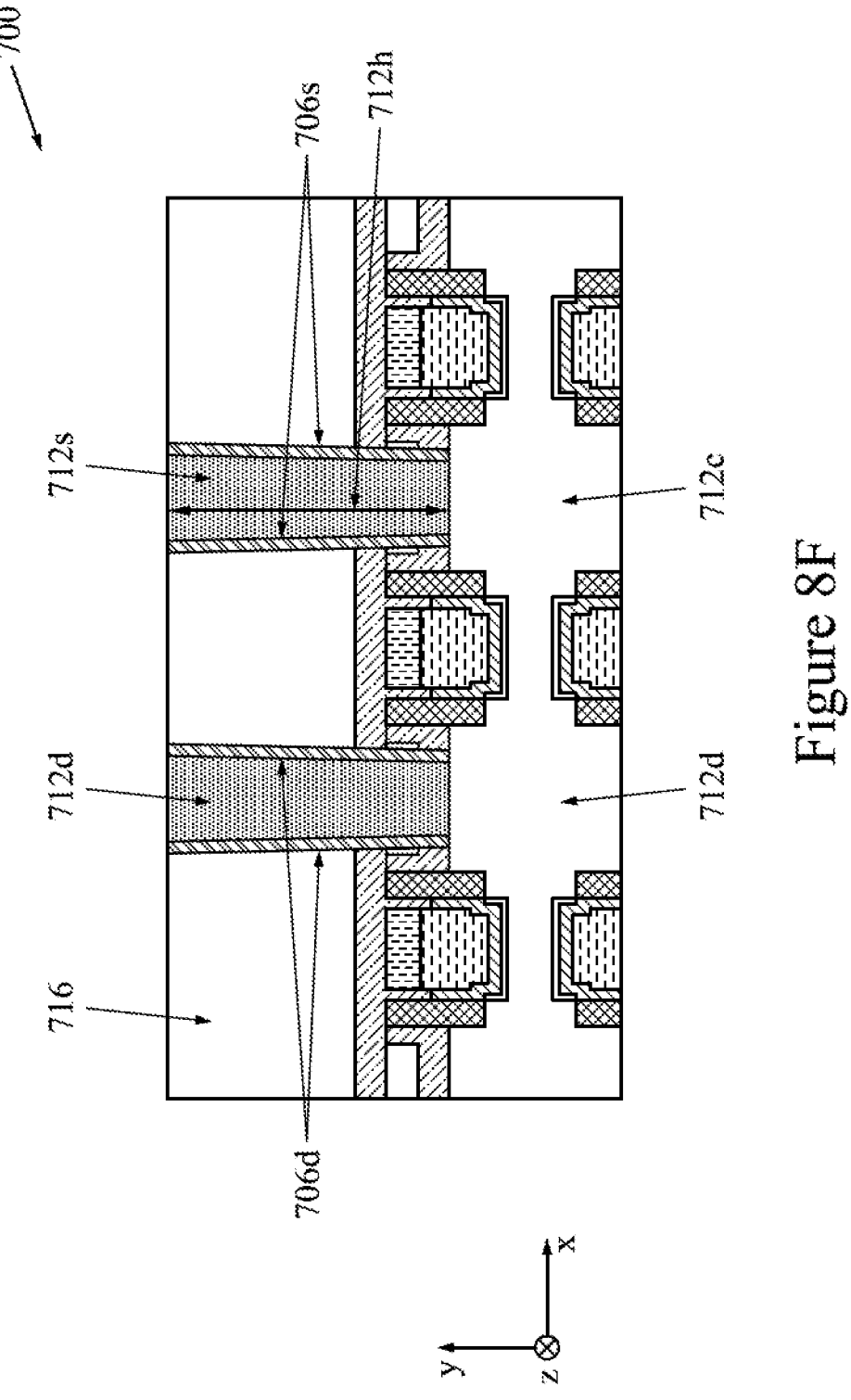

FIG. 8F is a stage of manufacturing source/drain contacts (which may be referred to herein as metal-to-device (MD) contacts) over the S/D regions 712b and 712c. In this fashion, only two MD contacts (712d and 712s) are shown for simplicity, however, the device 700 may include more than two MD contacts. The dielectric 716 covers top portion of the device 700 along the y axis as an ILD layer. Positions of the dielectrics 716 and 706 corresponding to the contacts 712d and 712s are patterned over the S/D regions 712b and 712c. In some examples, the position of the dielectrics 716 and 706 corresponding to the contacts 712d and 712s may be patterned using one or more photolithography processes. In some embodiments, the dielectrics 716 and 706 are etched by an etching method such as any of the etching methods described above for the embodiments of FIGS. 1A-6B. After the etching step, dielectric layers 706d and 706s are deposited in the etched areas to cover sidewalls of the etched areas. Material of the dielectric layers 706d and 706s may be the same as the material of dielectric 706. The dielectric layers 706d and 706s may be deposited by any conformal deposition methods or growing methods described above in the embodiments of FIGS. 1A-6B. Afterward, an anisotropic etching method, such as plasma etching, may be used to remove horizontal portions of the dielectric layers 706d and 706s along the y axis, while horizontal portions of the dielectric layers 706d and 706s remain on sidewalls of the contacts 712d and 712s. Then, the MD contacts 712d and 712s may be formed by filling the etched areas with a material such as aluminum (Al), copper (Cu), tungsten (W), titanium (Ti), tantalum (Ta), cobalt (Co), molybdenum (Mo), ruthenium (Ru), or another applicable material. In some examples, a height 712h of the MD contacts 712d and 712s along the y axis may be about 15 nm to about 40 nm. The height 712h lower in than about 15 nm may lead to electrical shorting between the external circuit and the capping layer of the gate electrode. The height 712h above about 40 nm may cause excessive conductive length and creating parasitic elements. After forming the MD contacts 712d and 712s, a surface of the device 700 along the y axis may be thinned and planarized by a chemical mechanical polishing (CMP) process.

Figure 8G:
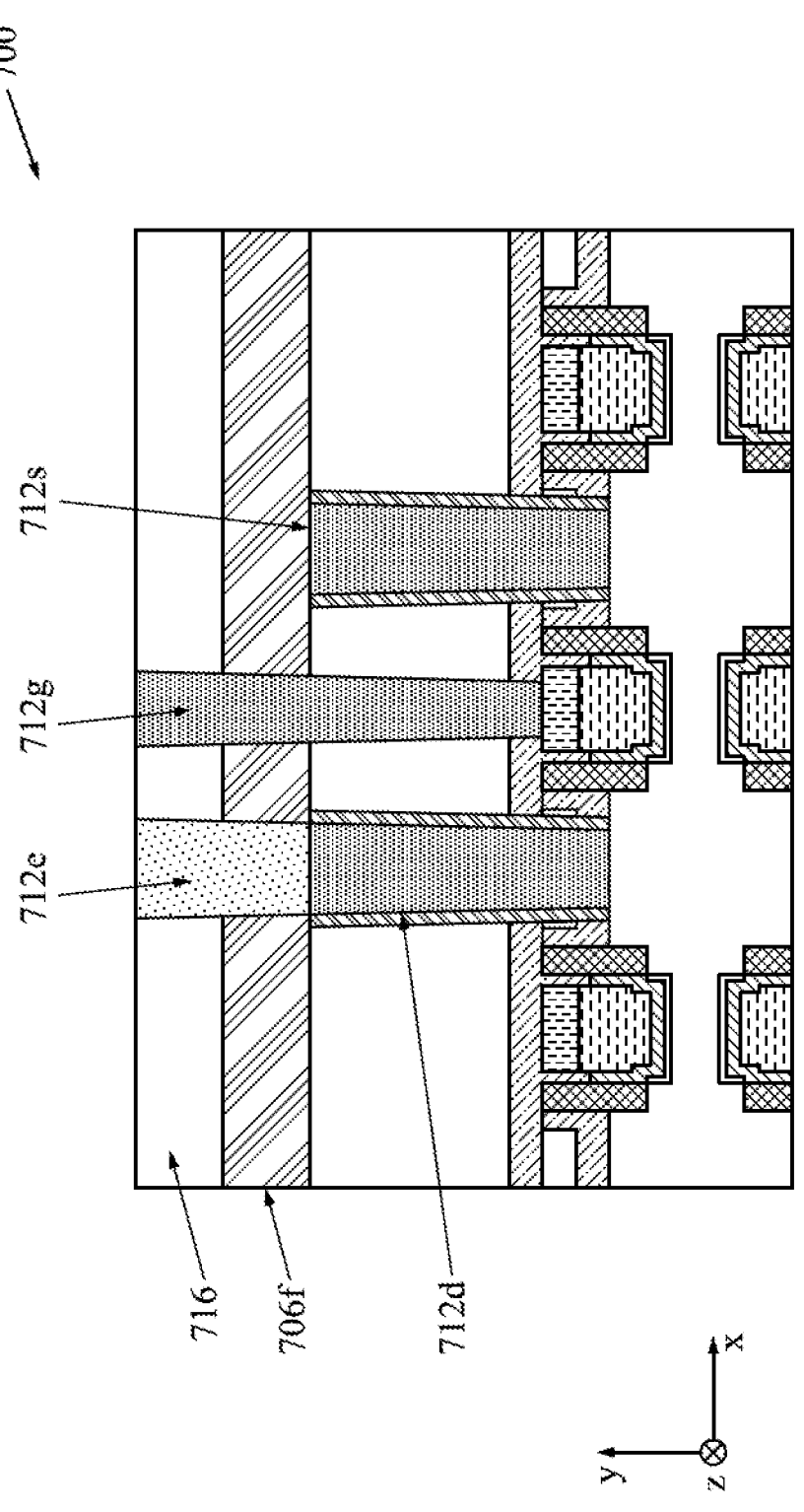

FIG. 8G is the final structure of manufacturing the device 700 in FIG. 7A. In this stage, the gate terminal and the drain terminal are formed as VG contact 712g and VD contact 712e to be coupled to external contacts. After the stage of FIG. 8F, a dielectric layer 706f including dielectric material 706 is formed over the device 700 along the y axis. In some examples, the dielectric layer 706f may form a contact etch stop layer (CESL). In addition, the dielectric 716 may cover the top portion of the device 700 over the dielectric layer 706f along the y axis. In this stage, positions of the dielectric layer 706f and the dielectric 716 corresponding to the VG and VD contacts 712g, 712e may be patterned and etched in the same way as the patterning and etching method described in FIG. 8F. Then, the etched positions may be filled by a material such as aluminum (Al), copper (Cu), tungsten (W), titanium (Ti), tantalum (Ta), cobalt (Co), molybdenum (Mo), ruthenium (Ru), or another applicable material. After forming the VG and VD contacts 712g, 712e, a surface of the device 700 along the y axis may be thinned and planarized by a chemical mechanical polishing (CMP) process.

Figure 9A:
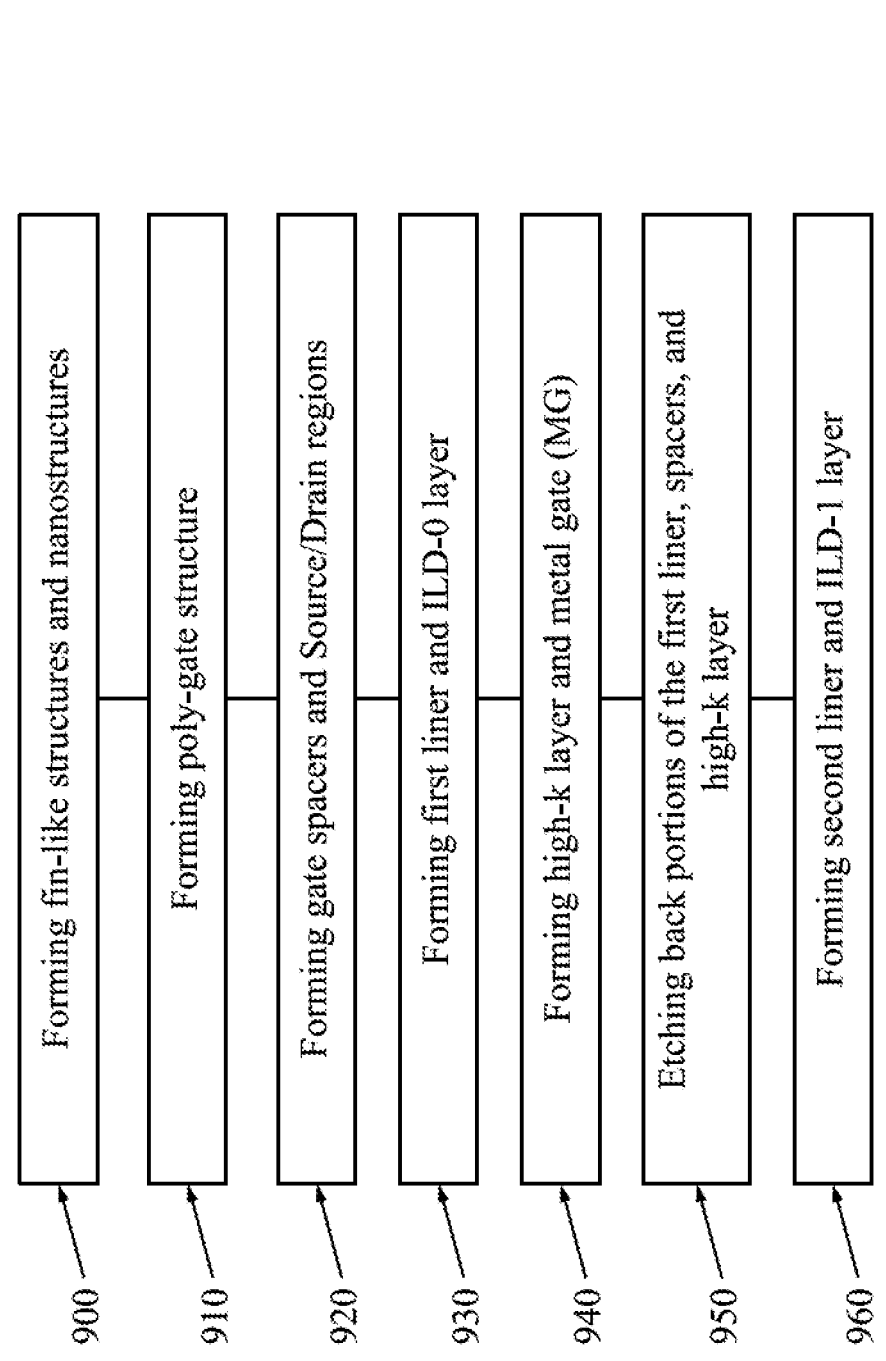
FIG. 9A is a flowchart schematically illustrating a process of forming a semiconductor device, in accordance with some embodiments.

FIG. 9A is a flowchart 900A of the process described in embodiments of FIGS. 2A-3D. Step 900 refers to the process of FIG. 2A. At 900, fin-like structures 100a-100d, semiconductor nanosheets 208, and sacrificial layers 209 of FIG. 2A are formed by the techniques that are described in FIG. 2A. At 910, the poly-gate structure is formed based on the process described in FIG. 2B. The poly-gate structure in FIG. 2B includes a dummy gate 202, a first mask 204, and a second mask 206. At 920, spacers 214a and 214b as well as source/drain regions 212a and 212b are formed by techniques that are described in FIG. 2C. At 930, the first liner 106b and dielectric layer 316 are formed as described in FIG. 3A. At 940, the metal gate 302 and high-k (HK) layer 304 are formed with techniques described in FIG. 3B. At 950, portions of the spacers 314a and 314b, first liner 106b, and HK layer 304 are etched back with techniques described in FIG. 3C. At 960, the second liner 106a and the dielectric layer 316a are formed with the techniques described in FIG. 3D. In various embodiments, the order of the steps may be changed and/or the process of each step may be different than the process described in embodiments of FIGS. 2A-3D.

Figure 9B:
FIG. 9B is a flowchart schematically illustrating a process of forming a semiconductor device, in accordance with some embodiments.

FIG. 9B is a flowchart 900B of the process described in embodiments of FIGS. 8A-8G. Step 902 refers to the process of FIG. 8A. At 902, gate electrode 702 and gate dielectric 704 are formed based on the process described in FIG. 8A. At 912, the gate electrode 702 is etched back with a technique described in FIG. 8B. At 922, capping layer 702p is formed over the etched portion of the gate electrode 702 based on the process described in FIG. 8C. At 932, the gate dielectric 704 is etched back to expose a top portion of the gate electrode 702 with a process described in FIG. 8D. At 942, the etched portion of the gate dielectric 704 is refilled with the dielectric 706 to form a dielectric capping layer with the process described in FIG. 8E. At 952, MD contacts 712d and 712s are formed on the source/drain regions 712b and 712c with a process described in FIG. 8F. Finally, at 962, VG contact 712g and VD contact 712e are formed as terminals of the circuit 700 with the process described in FIG. 8G. In various embodiments, the order of the steps may be changed and/or the process of each step may be different than the processes described in embodiments of FIGS. 8A-8G.

In accordance with at least one embodiment, a semiconductor device includes a channel region, a gate electrode, and first and second dielectric layers. The gate electrode at least partially surrounds the channel region, and the gate electrode has a first sidewall and a second sidewall opposite the first sidewall. The first dielectric layer is disposed between the channel region and the gate electrode. The second dielectric layer is disposed in direct contact with the first dielectric layer and with the first and second sidewalls of the gate electrode. A dielectric constant of the second dielectric layer is less than a dielectric constant of the first dielectric layer.

In accordance with at least one embodiment, a method is provided that includes forming a channel region of a transistor. The channel region includes a plurality of semiconductor nanostructures overlying and spaced apart from one another. A gate electrode is formed on the channel region, and the gate electrode has first and second sidewalls opposite one another. A first dielectric layer is formed between the gate electrode and the channel region, and a second dielectric layer is formed on the first and second sidewalls of the gate electrode. A dielectric constant of the second dielectric layer is less than a dielectric constant of the first dielectric layer.

In accordance with at least one embodiment, a method is provided that includes forming a semiconductor nanostructure. A gate electrode is formed at least partially surrounding the semiconductor nanostructure. A high-k dielectric layer is formed on opposing first and second sidewalls of the gate electrode and between the gate electrode and the semiconductor nanostructure. A first spacer is formed on the high-k dielectric layer, and the high-k dielectric layer extends laterally between the first spacer and the first sidewall of the gate electrode. A second spacer is formed on the high-k dielectric layer, and the high-k dielectric layer extends laterally between the second spacer and the second sidewall of the gate electrode. Recesses are formed by selectively removing at least portions of the high-k dielectric layer between the first spacer and the first sidewall of the gate electrode and between the second spacer and the second sidewall of the gate electrode. A second dielectric layer is formed in the recesses. A dielectric constant of the second dielectric layer is less than a dielectric constant of the high-k dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming a channel region of a transistor, the channel region including a plurality of semiconductor nanostructures overlying and spaced apart from one another;
   forming a first dielectric layer on the channel region;
   forming a gate electrode on the channel region, the gate electrode having first and second sidewalls opposite one another;
   forming a first spacer on the first dielectric layer by removing a portion of a first spacer layer, the first dielectric layer extending laterally between the first spacer and the first sidewall of the gate electrode;

forming a second spacer on the first dielectric layer by removing a portion of a second spacer layer, the first dielectric layer extending laterally between the second spacer and the second sidewall of the gate electrode;
   forming a plurality of recesses by removing the portion of the first spacer layer and removing the portion of the second spacer layer exposing respective surfaces of a plurality of source/drain regions, an interlayer dielectric layer, and a first liner layer between the plurality of source/drain regions and the interlayer dielectric layer;
   forming a second liner layer on the first liner layer, on the interlayer dielectric layer, on the one or more source/drain regions, and on the first sidewall and the second sidewall of the gate electrode, forming the second liner layer includes partially filling the plurality of recesses; and
   forming a second dielectric layer on the second liner layer filling respective remaining portions of the plurality of recesses.

2. The method of claim 1, further comprising:
   forming the one or more source/drain regions at one or more regions adjacent to one or more isolation trenches extending into a substrate.

3. The method of claim 2,
   wherein forming the one or more source/drain regions includes forming one or more concave surfaces of the one or more source/drain regions.

4. The method of claim 1, wherein forming the channel region of the transistor includes forming the plurality of semiconductor nanostructures overlying and spaced apart from one another.

5. The method of claim 1, further comprising, before forming the first dielectric layer, forming a third dielectric layer the channel region, and wherein the first dielectric layer is formed on the channel region, and the third dielectric extends from the channel region to the first dielectric layer.

6. The method of claim 5, wherein forming the channel region of the transistor includes forming the plurality of semiconductor nanostructures overlying and spaced apart from one another, wherein forming the gate electrode includes forming the gate electrode extending between the semiconductor nanostructures.

7. The method of claim 1, wherein the first dielectric layer is selected from ZrAlO, TiO, TaO, ZrO, LaO, HfO, AlO, YO, ZnO, and HZO.

8. A method, comprising:
   forming a channel region of a transistor, the channel region including one or more semiconductor nanostructures;
   forming one or more dielectric layers on the channel region;
   forming a gate electrode at least partially surrounding the one or more semiconductor nanostructures;
   and on the one or more dielectric layers, the one or more dielectric layers including a high-k dielectric layer between the channel region and the gate electrode, and the high-k dielectric layer is on a first sidewall of the gate electrode and a second sidewall of the gate electrode opposite to the first sidewall;
   forming a first spacer abutting the high-k dielectric layer by removing a portion of a first spacer layer, the high-k dielectric layer extending laterally between the first spacer and the first sidewall of the gate electrode;
   forming a second spacer abutting the high-k dielectric layer by removing a portion of the second spacer layer, the high-k dielectric layer extending laterally between the second spacer and the second sidewall of the gate electrode;

forming one or more recesses by removing the portion of the first spacer layer and by removing the portion of the second spacer layer exposing respective surfaces of one or more source/drain regions, an interlayer dielectric layer, and a first liner layer between the one or more source/drain regions and the interlayer dielectric layer;

forming a dielectric liner layer in and partially filling the one or more recesses, on the one or more source/drain regions, and on the first sidewall and the second sidewall of the gate electrode, wherein the second liner layer has a dielectric constant less than a dielectric constant of the high-k dielectric layer of the one or more dielectric layers; and forming a second dielectric layer on the second liner layer filling respective remaining portions of the one or more recesses.

9. The method of claim 8, further comprising planarizing respective surfaces of the gate electrode, the second liner layer, and the second dielectric layer.

10. The method of claim 8, wherein forming the one or more dielectric layers includes performing a plasma etching process having a precursor including carbon, hydrogen, and fluorine, and having a bias voltage of less than 10 volts.

11. The method of claim 10, wherein forming the one or more dielectric layers includes plasma etching the high-k dielectric layer of the one or more dielectric layers.

12. The method of claim 8, wherein the high-k dielectric layer is selected from ZrAlO, TiO, TaO, ZrO, LaO, HfO, AlO, YO, ZnO, and HZO.

13. The method of claim 8, wherein forming the one or more dielectric layers further includes forming an interfacial dielectric layer on the channel region and forming the high-k dielectric layer on the interfacial dielectric layer, and the interfacial dielectric layer having a dielectric constant less than the dielectric constant of the high-k dielectric layer.

14. The method of claim 8, wherein forming the one or more semiconductor nanostructures of the channel region includes forming a plurality of semiconductor nanosheets stacked one above another.

15. The method of claim 14 wherein forming the gate electrode includes forming the gate electrode to at least partially surround each of the semiconductor nanosheets.

16. A method, comprising:

forming a plurality of semiconductor nanostructures of a plurality of channel regions spaced apart from one another over a semiconductor substrate;

forming a gate electrode on the plurality of semiconductor nanostructures of the plurality of channel regions, the gate electrode having a first sidewall and a second sidewall opposite to the first sidewall;

forming a first dielectric layer between the gate electrode and each of the plurality of channel regions;

forming a first spacer by removing a portion of a first spacer layer adjacent the first sidewall of the gate electrode and a second spacer by removing a portion of a second spacer layer adjacent the second sidewall of the gate electrode, the first dielectric layer extending laterally between first spacer and the first sidewall of the gate electrode, and the first dielectric layer extending laterally between the second spacer and the second sidewall of the gate electrode;

forming a plurality of recesses by removing the portion of the first spacer layer and by removing the portion of the second spacer layer exposing respective surfaces of a plurality of source/drain regions, an interlayer dielectric layer, and a first liner layer between the plurality of source/drain regions and the interlayer dielectric layer;

forming a second liner layer in the plurality of recesses, on the plurality of source/drain regions, and on the first sidewall and the second sidewall of the gate electrode, and wherein the second dielectric liner layer having a dielectric constant less than the dielectric constant of the first dielectric layer; and forming a second dielectric layer on the second liner layer and in the plurality of recesses.

17. The method of claim 16, further comprising planarizing respective surfaces of the gate electrode, the second liner layer, and the second dielectric layer.

18. The method of claim 16, further comprising forming an interfacial layer between the first dielectric layer and each of the plurality of channel regions, the interfacial layer having a dielectric constant less than the dielectric constant of the first dielectric layer.

19. The method of claim 16, wherein the first dielectric layer comprises a high-k material selected from ZrAlO, TiO, TaO, ZrO, LaO, HfO, AlO, YO, ZnO, and HZO.

20. The method of claim 16, further comprising removing one or more portions of the first dielectric layer by performing a plasma etch using a precursor containing carbon, hydrogen, and fluorine at a bias voltage of less than 10 volts.

* * * * *